United States Patent [19]
Takeuchi

[11] Patent Number: 6,100,837
[45] Date of Patent: Aug. 8, 2000

[54] A-D CONVERTER

[75] Inventor: Minoru Takeuchi, Tokyo, Japan

[73] Assignee: Mitsubishi Denki Kabushiki Kaisha, Tokyo, Japan

[21] Appl. No.: 09/111,876

[22] Filed: Jul. 8, 1998

[30] Foreign Application Priority Data

Jan. 14, 1998 [JP] Japan ............................. P10-005732

[51] Int. Cl.⁷ ...................................................... H03M 1/38
[52] U.S. Cl. ............................................................ 341/161
[58] Field of Search ...................................... 341/161, 155, 341/162, 163, 164, 118, 165

[56] References Cited

U.S. PATENT DOCUMENTS

| 5,870,052 | 2/1999 | Dedic et al. | 341/161 |
| 6,020,841 | 2/1999 | Susak | 341/161 |

FOREIGN PATENT DOCUMENTS

| 54-153560 | 12/1979 | Japan . |
| 2-246621 | 10/1990 | Japan . |
| 5-29941 | 2/1993 | Japan . |
| 5-235767 | 9/1993 | Japan . |
| 6-53834 | 2/1994 | Japan . |
| 8-84075 | 3/1996 | Japan . |
| 9-83316 | 3/1997 | Japan . |

Primary Examiner—Brian Young
Attorney, Agent, or Firm—Burns, Doane, Swecker & Mathis, LLP

[57] ABSTRACT

A chopper compare circuit of an A-D converter implemented through a semiconductor integrated circuit is provided with a series-connected body of a plurality of MOS capacitors to which the voltage of an analog signal and a reference voltage are alternately applied. A-D conversion errors resulting from change of the capacitances of the MOS capacitors depending on voltages between both electrodes thereof are reduced. A MOS capacitor is connected in parallel with or disconnected from a MOS capacitor, in response to a voltage across electrodes of a MOS capacitor.

10 Claims, 18 Drawing Sheets

GATE ELECTRODE VOLTAGE REFERENCE
TO POTENTIAL OF DIFFUSION LAYER

A-D CONVERTER

BACKGROUND OF THE INVENTION

1. Field of the Invention

The present invention relates to an A-D converter, and more particularly, it relates to an A-D converter of a sequential comparison system formed on a semiconductor integrated circuit, which employs a plurality of serially connected MOS capacitors for detecting the voltage of an analog signal.

2. Description of the Background Art

A-D converters for converting analog signals to digital signals are provided in various systems. For example, Japanese Patent Laying-Open Gazette No. 5-29941 (1993) discloses an invention related to a parallel-serial converter, and Japanese Patent Laying-Open Gazette No. 9-83316 (1997) discloses an A-D converter of a two-step parallel system. The present invention relates to an A-D converter of a sequential comparison system. For example, Japanese Patent Laying-Open Gazettes Nos. 2-246621 (1990), 5-235767 (1993) and 6-53834 (1994) disclose A-D converters of the sequential comparison system Among the inventions disclosed in these gazettes, the invention described in Japanese Patent Laying-Open Gazette No. 6-53834 has been proposed in order to reduce nonlinear errors in the A-D converter, and has the same object as that of the present invention. However, although the A-D converter disclosed in Japanese Patent Laying-Open Gazette No. 6-53834 and the A-D converter according to the present invention are identical in system to each other, the circuit structures thereof are remarkably different from each other, and hence the A-D converter described in the above gazette is not employed for describing problems of the prior art. On the other hand, Japanese Patent Laying-Open Gazette No. 54-153560 (1979) discloses means for correcting errors caused in steps of fabricating an A-D converter.

FIG. 16 is a circuit diagram showing an exemplary structure of a conventional A-D converter 1. The A-D converter 1 shown in FIG. 16 is remarkably different in circuit structure from the A-D converters described in all aforementioned gazettes.

The A-D converter 1 is formed by a voltage generating circuit 2 for generating a plurality of reference voltages, a compare circuit 3 for comparing the level of an analog signal VIN with a level generated from first and second reference voltages, for example, and a sequential approximate register SAR for storing data for controlling the reference voltages outputted from the voltage generating circuit 2.

The voltage generating circuit 2 includes a resistive ladder network 4 for evenly dividing a ground voltage GND and a reference voltage VREF and generating reference voltages (tap voltages) VT0 to VT15. Namely, resistances R0 to R15 having the same resistance values are serially connected with each other, to form the resistive ladder network 4. The compare circuit 3, which is a chopper circuit, is formed by a MOS capacitor C1 having first and second electrodes, a MOS capacitor C2 having first and second electrodes and connecting the second electrode to that of the MOS capacitor C1, switches S-pre1, S-pre2, S-cmp1, S-cmp2 and S-chop, and a CMOS inverter 5 having input and output terminals and connecting the input terminal to a node N1 between the MOS capacitors C1 and C2. The MOS capacitors C1 and C2 are serially connected with each other to form a single series-connected body 6. The analog signal VIN and the first reference voltage are applied to a first end (the first electrode of the MOS capacitor C1) of the series-connected body 6 through the switches S-pre1 and S-cmp1 respectively. A first switch group 7 selects the first reference voltage from the plurality of reference voltages generated by the voltage generating circuit 2. On the other hand, the ground voltage GND and the second reference voltage are applied to a second end (the first electrode of the MOS capacitor C2 ) of the series-connected body 6 through the switches S-pre2 and S-cmp2 respectively. A second switch group 8 selects the second reference voltage from the plurality of reference voltages generated by the voltage generating circuit 2.

The A-D converter 1 has resolution of six bits, so that four bits relate to the structure of the resistive ladder network 4 and the remaining two bits relate to the structures of the MOS capacitors C1 and C2.

In order to simplify the illustration, an offset adjusting circuit is omitted from the circuit diagram of the A-D converter 1.

The A-D converter 1 decides the values of the bits B5 to B0 successively from the most significant bit B5 by sequential comparison. The A-D converter 1 decides whether the most significant bit B5 is "1" or "0" through comparison as to whether the voltage of the analog signal VIN is larger or smaller than half the reference voltage VREF. Throughout the specification, it is assumed that numerals with "" marks are binary numbers. Then, the A-D converter 1 decides the value of the bit B4 which is lower than the most significant bit B5 by one order, and decides the values of the remaining bits B3 to B0 in descending order In order to perform such sequential comparison, the A-D converter 1 first closes a switch S1-8 in the first switch group 7 while closing a switch S2-0 in the second switch group 8, and then successively closes the remaining switches to change the voltages by half preceding voltage change. Namely, the A-D converter 1 closes a switch S1-4 or S1-12 following the switch S1-8, then a switch S1-2, S1-6, S1-10 or S1-14, and then a switch S1-1, S1-3, S1-5, S1-7, S1-9, S1-11, S1-13 or S1-15. When settling a finally selected switch of the first switch group 7, the A-D converter 1 stops the switch selecting operation for the first switch group 7 and performs a selecting operation for the second switch group 8. The A-D converter 1 first closes a switch S2-2, and then a switch S2-1 or S2-3.

A detection circuit 9 performs comparison in stages of deciding the respective bits B5 to B0. The detection circuit 9 compares the voltage of the node N1 between the MOS capacitors C1 and C2 in application of the analog signal VIN with reference to the voltage GND to the MOS capacitors C1 and C2 with the voltage of the node N1 in application of the voltage generated in the resistive ladder network 4 to the MOS capacitors C1 and C2. In this comparison, the detection circuit 9 first closes the switch S-chop and precharges the voltage of the threshold voltage. The threshold voltage, which is employed as the reference for the detection to be compared with a voltage applied to the input terminal by the detection circuit 9, coincides with a precharge voltage. FIG. 17 is a graph showing the relation between the threshold voltage and input and output voltages of the CMOS inverter 5. Referring to FIG. 17, power supply voltages supplied to the CMOS inverter 5 are 0 V and VDD, and the threshold voltage of the CMOS inverter 5 is 0.5VDD. In precharging, the analog signal VIN and the ground voltage GND are applied to the first electrodes of the MOS capacitors C1 and C2 respectively.

Following completion of the precharging, the compare circuit 3 opens the switch S-chop and increases the input impedance thereby bringing the node N1 between the MOS capacitors C1 and C2 into a floating state, and compares the voltage of the node N1 with a threshold voltage VTH1. At this time, any two of the reference voltages VT0 to VT15 generated in the resistive ladder network 4 are applied to the first electrodes of the MOS capacitors C1 and C2 as the first and second reference voltages respectively.

With reference to FIG. 18, the operation of the A-D converter 1 is now described in association with operations of the switches S-pre1, S-pre2, S-cmp1, S-cmp2 and S-chop of the compare circuit 3 and the switches S1-0 to S1-15 and S2-0 to S2-3 of the voltage generating circuit 2. FIG. 18 is a timing chart for illustrating the operation of the conventional A-D converter 1.

The A-D converter 1 closes the switch S-chop of the compare circuit 3 at a time t1. At the same time, the A-D converter 1 closes the switches S-pre1 and S-pre2 and opens the switches S-cmp1 and S-cmp2. In this state, charges are supplied through the switch S-chop for maintaining the voltage of the node N1 between the MOS capacitors C1 and C2 at the threshold voltage VTH1 of the compare circuit 3 (the detection circuit 9). The threshold voltage VTH1, which is the threshold voltage of the CMOS inverter 5 formed by transistors TR1 and TR2, serves as a precharge voltage in precharging. A voltage corresponding to the difference between the voltage of the analog signal VIN and the threshold voltage VTH1 is applied to the MOS capacitor C1. On the other hand, a voltage corresponding to the difference between the threshold voltage VTH1 and the voltage GND is applied to the MOS capacitor C2.

At a time t2, the A-D converter 1 opens the switch S-chop. The CMOS inverter 5 has a high input impedance, i.e., the node N1 is in a floating state, thereby maintaining the voltage of the node N1. Between the time t2 and a time t3 the A-D converter 1 opens the switches S-pre1 and S-pre2 while simultaneously closing the switch S-cmp1 and S-cmp2. The A-D converter 1 selectively closes the switch S1-0 to S1-15 and S2-0 to S2-3 in the first and second switch groups 7 and 8 of the voltage generating circuit 2 in accordance with the data of the sequential approximate register SAR, in relation shown in Tables 1 and 2 with the data of the sequential approximate register SAR.

TABLE 1

| B5 | B4 | B3 | B2 | closed switch |
|----|----|----|----|---------------|
| 0  | 0  | 0  | 0  | S1-0          |
| 0  | 0  | 0  | 1  | S1-1          |
| 0  | 0  | 1  | 0  | S1-2          |
| 0  | 0  | 1  | 1  | S1-3          |
| 0  | 1  | 0  | 0  | S1-4          |
| 0  | 1  | 0  | 1  | S1-5          |
| 0  | 1  | 1  | 0  | S1-6          |
| 0  | 1  | 1  | 1  | S1-7          |
| 1  | 0  | 0  | 0  | S1-8          |
| 1  | 0  | 0  | 1  | S1-9          |
| 1  | 0  | 1  | 0  | S1-10         |
| 1  | 0  | 1  | 1  | S1-11         |
| 1  | 1  | 0  | 0  | S1-12         |
| 1  | 1  | 0  | 1  | S1-13         |
| 1  | 1  | 1  | 0  | S1-14         |
| 1  | 1  | 1  | 1  | S1-15         |

TABLE 2

| B1 | B0 | closed switch |
|----|----|---------------|
| 0  | 0  | S2-0, S3-0    |
| 0  | 1  | S2-1, S3-1    |
| 1  | 0  | S2-2, S3-2    |
| 1  | 1  | S2-3, S3-3    |

Between the times t1 to t3, the sequential approximate register SAR stores data having a value "100000". During the times t1 to t3, therefore, the switches S1-8 and S2-0 are closed. The compare circuit 3 makes comparison while the switches S-cmp1 and S-cmp2 are closed. The A-D converter 1 settles the value of the most significant bit B5 of an outputted digital signal at "1" if the voltage of the node N1 between the MOS capacitors C1 and C2 is higher than the threshold voltage VTH1, otherwise at "0".

In comparison made between the time t3 and a time t5, data of the sequential approximate register SAR is "110000" if the value of the most significant bit B5 of the digital signal is "1", or the data is "010000" if the value is "0". During the times t3 to t5, the switch S1-12 is closed if the data of the sequential approximate register SAR is "110000", or the switch S1-4 is closed if the data is "01000" for comparison. The A-D converter 1 continues such sequential comparison, for successively deciding the values of the respective bits B5 to B0 of the digital signal in descending order.

In the sequential comparison, the voltage VN1 of the node N1 between the MOS capacitors C1 and C2 is expressed as follows:

$$VN1 = VTH1 - \frac{C1 \times \left(VIN - VREF \times \frac{[B5:B2]}{16}\right) + C2 \times \left(0 - VREF \times \frac{[B1:B0]}{16}\right)}{C1 + C2} \quad (1)$$

where [:] is a symbol forming a decimal value from binary data. For example, [B5:B2] indicates decimal expression of a value expressed in four digits consisting of the bits B5 to B2 of the sequential approximate register SAR. Further, [B1:B0] indicates decimal expression of a value expressed in two digits consisting of the bits B1 and B0 of the sequential approximate register SAR. When the sequential approximate register SAR stores data "110010", for example, [B5:B2] expresses 12 and [B1:B0] expresses 2. Assuming that the capacity of the MOS capacitor C1 is four times that of the MOS capacitor C2, application of the condition C1=C2×4 to the above expression 1 leads to the following expression 2:

$$VN1 = VTH1 - \frac{4 \times \left(VIN - VREF \times \frac{[B5:B2]}{16}\right) + \left(0 - VREF \times \frac{[B1:B0]}{16}\right)}{5}. \quad (2)$$

The compare circuit 3 outputs "1" when the voltage VN1 of the node N1 is lower than the threshold voltage VTH1, i.e., the condition described in the following expression 3 is satisfied:

$$8 \times \left( VIN - VREF \times \frac{[B5:B2]}{16} \right) + \frac{0 - VREF \times \frac{[B1:B0]}{16}}{9} > 0 \quad (3)$$

The following relation holds between the analog signal VIN inputted in the A-D converter 1 and a voltage expressed by a digital signal OUT outputted from the A-D converter 1. The A-D converter 1 decides the digital signal OUT at the maximum value satisfying the relation of the following expression 4:

$$VREF \times \frac{[B5:B2]}{16} + VREF \times \frac{[B1:B0]}{64} = \frac{VREF \times :[B5:B0]}{64} < VIN \quad (4)$$

In other words, the analog signal VIN is within the range of the following expression 5, when the sequential approximate register SAR obtains specific data $$[B5:B0]: VREF \times \frac{[B5:B0]+1}{64} > VIN > VREF \times \frac{[B5:B0]}{64} \quad (5)$$

The relations in the above expressions 1 to 5 hold when the elements, such as resistances and capacitances, for example, of the A-D converter 1 shown in FIG. 16 have ideal characteristics. In reality, however, the elements of the A-D converter 1 not necessarily have ideal characteristics. Particularly when the A-D converter 1 is to be implemented on a semiconductor integrated circuit, the series-connected body 6 frequently utilizes the MOS capacitors C1 and C2. Each of the MOS capacitors C1 and C2, which is in a structure shown in FIG. 19, for example, has a capacitance-bias voltage characteristic shown in FIG 20, for example. FIG. 19 is a model diagram showing the sectional structure of each MOS capacitor employed in the conventional A-D converter 1. FIG. 20 is a graph showing the relation between a gate electrode voltage (horizontal axis) with reference to the potential of a diffusion layer and the capacitance (vertical axis) of each MOS capacitor. Referring to FIG. 19, a gate electrode 10 and a diffusion layer 12 are formed through a gate oxide film 11, so that the MOS capacitor has a capacitance between the gate electrode 10 and the diffusion layer 12. The remaining elements of the A-D converter 1 are also formed on a silicon substrate 13 serving as the base for forming the gate electrode 10, the gate oxide film 11 and the diffusion layer 12.

When the structure shown in FIG. 19 is applied to each of the MOS capacitors C1 and C2 shown in FIG. 16, the gate electrode 10 is connected to the input terminal (gate electrodes of the transistors TR1 and TR2) of the CMOS inverter 5, in order to avoid a bad influence from a parasitic capacitance. When the analog signal VIN is at a high voltage and hence any switch (e.g., S1-15) of the first switch group 7 closer to the terminal receiving the reference voltage VREF conducts, the potential of the diffusion layer 12 of the MOS capacitor C1 becomes higher than that of the gate electrode 10 and the capacitance of the MOS capacitor C1 is less than four times that of the MOS capacitor C2. When [B1:B0] is nonzero, therefore, the A-D converter 1 causes an error in A-D conversion. Thus, the relation shown in the following expression 6 takes place between the voltage indicated by the digital signal [B5:B0] obtained in the sequential approximate register SAR and the analog signal VIN:

$$VREF \times \frac{[B5:B0]+1}{64} + \Delta V1 > VIN > VREF \times \frac{[B5:B0]}{64} + \Delta V2 \quad (6)$$

where $\Delta V1$ and $\Delta V2$ represent errors caused in [B5:B0] +1 and [B5:B0] respectively, which are maximized when [B5:B0] +1 and [B5:B0] are 4n+3 respectively (n=9–15) and minimized when these values are zero.

While the A-D converter 1 closes any switch of the first switch group 7, the errors resulting from capacitance change of the MOS capacitor C1 are increased as the voltage selected in accordance with the closed switch is closer to the reference voltage VREF. FIG. 21 is a graph showing the result of the above expression 6, i.e., the error characteristic of A-D conversion, and illustrates the relation between the values of the digital signal and the errors.

In order to suppress the errors resulting from capacitance change of the MOS capacitor C1, bias voltage dependence of the MOS capacitor C1 may be reduced. For this purpose, the impurity concentration of the diffusion layer 12 of the MOS capacitor C1 is increased in general. In case of injecting an impurity with an injector, however, it is necessary to inject the impurity over a long time if the injection rate per unit time cannot be increased, leading to reduction of producibility.

In the conventional A-D converter having the aforementioned structure, the capacitance of each MOS capacitor varies with the voltage applied across its electrodes, to disadvantageously cause errors in the values shown by the analog and digital signals.

SUMMARY OF THE INVENTION

According to a first aspect of the present invention, an A-D converter comprises a voltage generating circuit for generating first and second reference voltages with reference to a prescribed voltage, and a compare circuit having a series-connected body which includes a plurality of serially interconnected MOS capacitors and has first and second ends for applying an analog signal and the prescribed voltage to the first and second ends of the series-connected body respectively while applying a precharge voltage to a prescribed node of the series-connected body for supplying charges, and comparing with a predetermined threshold voltage a voltage generated on the prescribed node when applying the first and second reference voltages to the first and second ends of the series-connected body in place of the analog signal and the prescribed voltage respectively while stopping application of the precharge voltage. The series-connected body has a first capacitance between the prescribed node and the first end of the series-connected body, and a second capacitance, which is different from the first capacitance, between the prescribed node and the second end of the series-connected body, and the compare circuit adjusts the ratio of the first to second capacitances in accordance with at least one of the first and second reference voltages.

In the A-D converter according to the first aspect of the present invention, it is possible to effectively suppress change of the ratio of the first capacitance to the second capacitance resulting from capacitance change caused in the MOS capacitors depending on a bias voltage, for correcting the voltage generated in the series-connected body and reducing A-D conversion errors.

According to a second aspect of the present invention, the voltage generating circuit fixes the second reference voltage at the prescribed voltage and changes the value of the first reference voltage by half the preceding change every time the compare circuit repeats comparison, and then stops changing the first reference voltage and changes the value of the second reference voltage by half the preceding change every time the compare circuit repeats comparison, and the compare circuit has a capacitance, which is smaller than that existing between the prescribed node and the first end of the series-connected body, between the prescribed node and the second end of the series-connected body, while the A-D converter further comprises an adjusting capacitor for switching connection and disconnection with the series-connected body about a prescribed value of the first reference voltage for adjusting the ratio of the first capacitance to the second capacitance.

Thus, the A-D converter according to the second aspect of the present invention converts the first or second capacitance of the series-connected body in response to connection and disconnection of the adjusting capacitor in the structure of changing the first reference voltage by half the preceding change every time the compare circuit repeats comparison, whereby the number of times for switching connection and disconnection can be suppressed to the minimum and the structure of the A-D converter can be simplified.

According to a third aspect of the present invention, the adjusting capacitor is connected in parallel with the second capacitance when the analog signal is larger than a prescribed value, while being disconnected when the analog signal is smaller than the prescribed value.

According to a fourth aspect of the present invention, the adjusting capacitor is connected in parallel with the first capacitance when the analog signal is smaller than a prescribed value, while being disconnected when the analog signal is larger than the prescribed value.

According to a fifth aspect of the present invention, an A-D converter comprises a voltage generating circuit for generating first and second reference voltages with reference to a prescribed voltage, and a compare circuit having a series-connected body which includes a plurality of serially interconnected MOS capacitors and has first and second ends for applying an analog signal and the prescribed voltage to the first and second ends of the series-connected body respectively while applying a precharge voltage to a prescribed node of the series-connected body for supplying charges, and comparing with a predetermined threshold voltage a voltage generated on the prescribed node when applying the first and second reference voltages to the first and second ends of the series-connected body in place of the analog signal and the prescribed voltage respectively while stopping application of the precharge voltage. The series-connected body has a first capacitance between the prescribed node and the first end of the series-connected body, and a second capacitance, which is bigger than the first capacitance between the prescribed node and the second end of the series-connected body, and the compare circuit further has voltage shift circuit for shifting a voltage which is applied between the first end of the series-connected body and the prescribed node in a reducing direction.

In the A-D converter according to the fifth aspect of the present invention, the voltage shift circuit reduces the voltage applied between the first end of the series-connected body and the prescribed node, whereby change of the first capacitance depending on the bias voltage for the MOS capacitors can be suppressed, the voltage generated in the series-connected body can be corrected and A-D conversion errors can be reduced.

According to a sixth aspect of the present invention, the voltage shift circuit shifts the precharge voltage and the threshold voltage by the same value.

Thus, the A-D converter according to the sixth aspect of the present invention can reduce capacitance change of the MOS capacitors depending on the bias voltage by increasing the precharge voltage and the threshold voltage, for effectively correcting the voltage generated in the series-connected body and reducing A-D conversion errors.

According to a seventh aspect of the present invention, the compare circuit further includes a first transistor having a control electrode which is connected to the prescribed node, a first current electrode which is connected to a first power source, and a second current electrode which is connected to an output terminal of the compare circuit, a second transistor having a control electrode which is connected to the prescribed node, a first current electrode which is connected to a second power source and a second current electrode which is connected to the output terminal of the compare circuit, and a switch which is connected between the control electrode and the second current electrode of the first transistor to be closed when setting the prescribed node of the series-connected body at the precharge voltage and open when comparing the voltage generated on the prescribed node with the predetermined threshold voltage, and the voltage shift circuit includes a structure for rendering a transistor amplification coefficient of the first transistor smaller than that of the second transistor.

Thus, the A-D converter according to the seventh aspect of the present invention can increase the precharge voltage and the prescribed voltage by simply changing the sizes of the transistors forming the compare circuit, for example, thereby effectively preventing complication of the circuit.

According to an eighth aspect of the present invention, an A-D converter comprises a voltage generating circuit for generating first and second reference voltages with reference to a prescribed voltage, and a compare circuit having a series-connected body which includes a plurality of serially interconnected MOS capacitors and has first and second ends for applying an analog signal and the prescribed voltage to the first and second ends of the series-connected body respectively while applying a precharge voltage to a prescribed node of the series-connected body for supplying charges, and comparing with a predetermined threshold voltage a voltage generated on the prescribed node when applying the first and second reference voltages to the first and second ends of the series-connected body in place of the analog signal and the prescribed voltage respectively while stopping application of the precharge voltage. The series-connected body has a first capacitance between the prescribed node and the second end of the series-connected body, and second capacitance, which is bigger than the first capacitance, between the prescribed node and the first end of the series-connected body, and the voltage generating circuit adjusts at least one of the prescribed voltage and the second reference voltage for compensating for change of a charge quantity which is caused in the series-connected body by change of the first capacitance.

Thus, the A-D converter according to the eighth aspect of the present invention can compensate for change of the charge quantity caused in the series-connected body by change of the first capacitance by adjusting at least one of the prescribed voltage and the second reference voltage, for effectively correcting the voltage generated in the series-connected body and reducing A-D conversion errors.

According to a ninth aspect of the present invention, the voltage generating circuit has an adjusting circuit for adjusting the prescribed voltage and the second reference voltage so that the difference between a voltage applied between the prescribed node and the first end of the series-connected body and that applied between the prescribed node and the second end of the series-connected body is below a prescribed value.

In the A-D converter according to the ninth aspect of the present invention, the adjusting circuit can adjust the prescribed voltage and the second reference voltage so that the difference between the voltage applied between the prescribed node and the first end of the series-connected body and that applied between the prescribed node and the second end of the series-connected body is not in excess of the prescribed value, whereby it is possible to effectively compensate for change of the charge quantity caused in the series-connected body by change of the capacitance between the first end of the series-connected body and the prescribed node by a simple circuit.

According to a tenth aspect of the present invention, the prescribed voltage is a ground voltage, the voltage generating circuit further includes a plurality of resistances which are serially connected between a reference voltage and the ground voltage, a first group of switches for selecting one of a plurality of divided voltages generated on respective nodes of the plurality of resistances as the first reference voltage, a second group of switches for selecting one divided voltage from a first group of divided voltages among the plurality of divided voltages as the second reference voltage, and a third group of switches for selecting one divided voltage from a second group of divided voltages, having values closer to the reference voltage than the first group of divided voltages, among the plurality of divided voltages as the second reference voltage, and the adjusting circuit includes a fourth group of switches for further selecting the divided voltages selected by the second and third groups of switches and applying the same to the second end of the series-connected body, and a fifth group of switches for selecting predetermined first and second divided voltages from the plurality of divided voltages, the ground voltage and the reference voltage as the prescribed voltage and applying the same to the second end of the series-connected body.

Accordingly, an object of the present invention is to obtain a highly accurate A-D converter by employing MOS capacitors while suppressing errors resulting from capacitance change of the MOS capacitors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
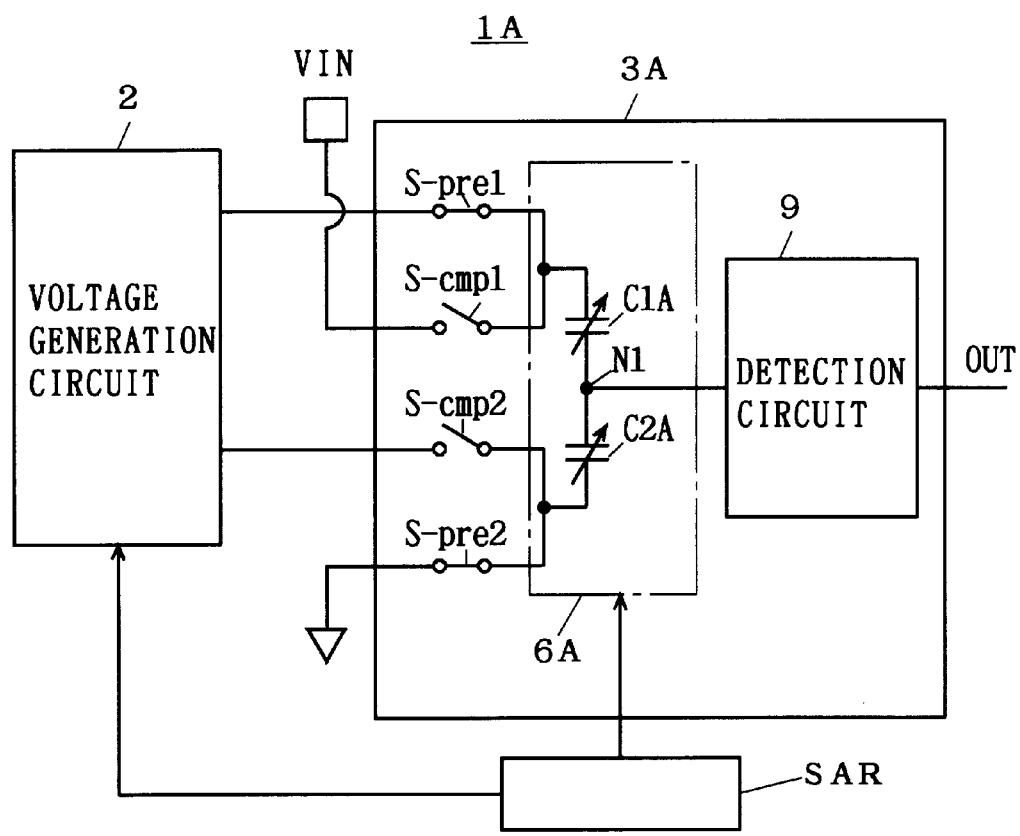
FIG. 1 is a block diagram schematically showing the structure of an A-D converter according to an embodiment 1 of the present invention.
Figure 16:
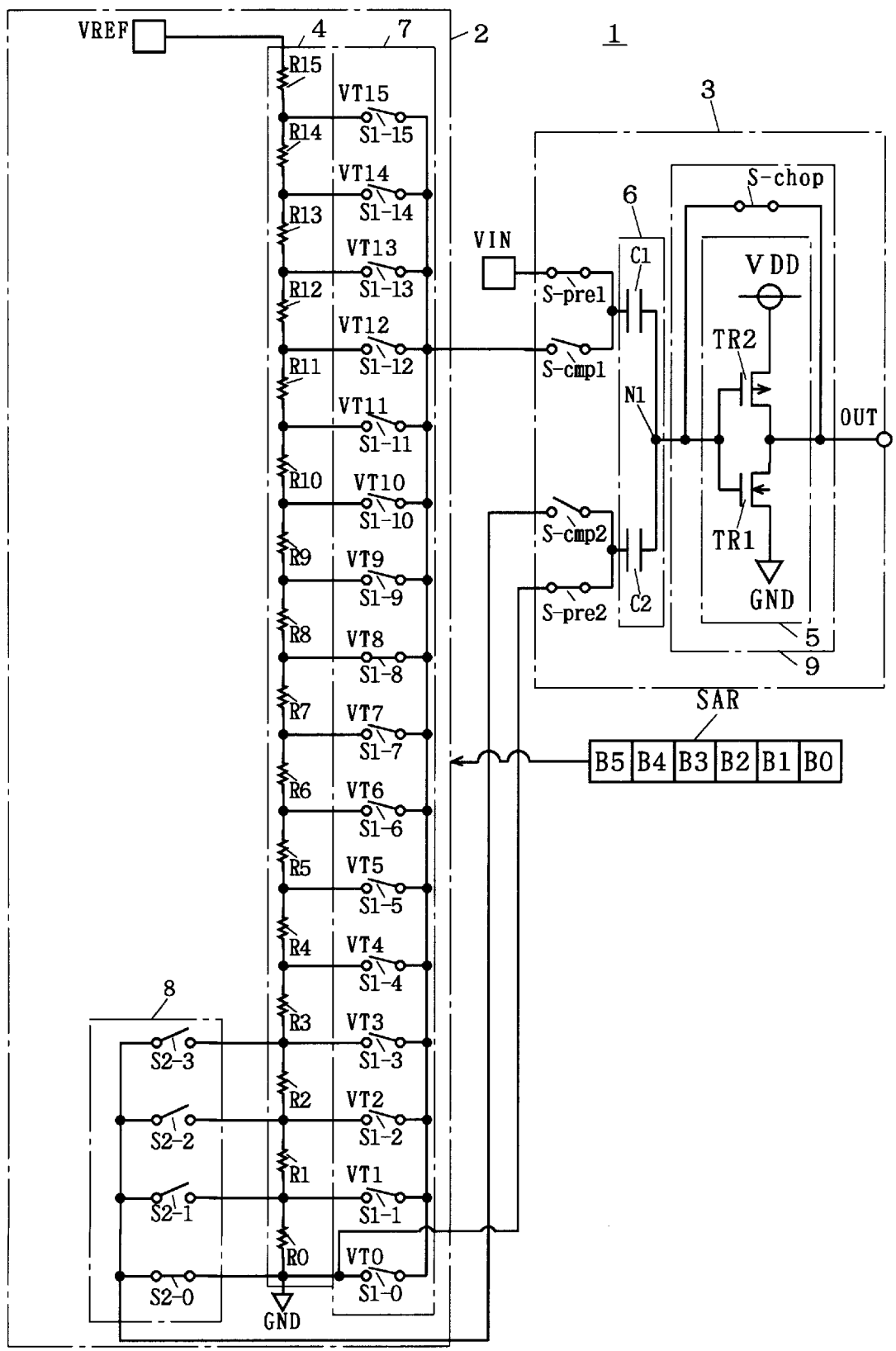
FIG. 16 is a circuit diagram showing an exemplary structure of a conventional A-D converter.
Figure 17:
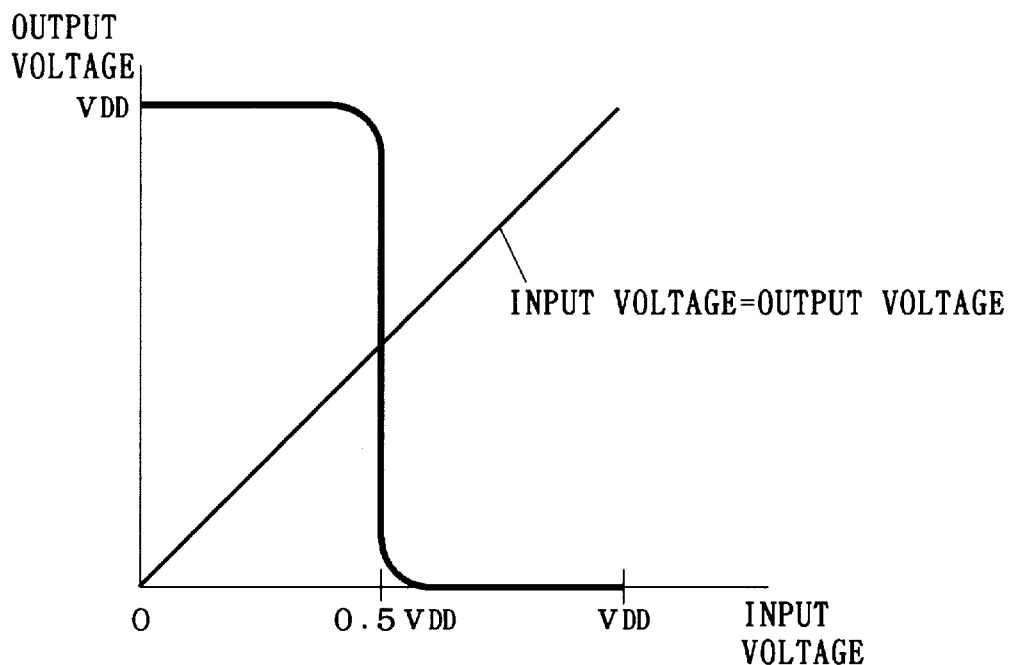
FIG. 17 is a graph showing the input/output characteristic of a conventional CMOS inverter.
Figure 18:
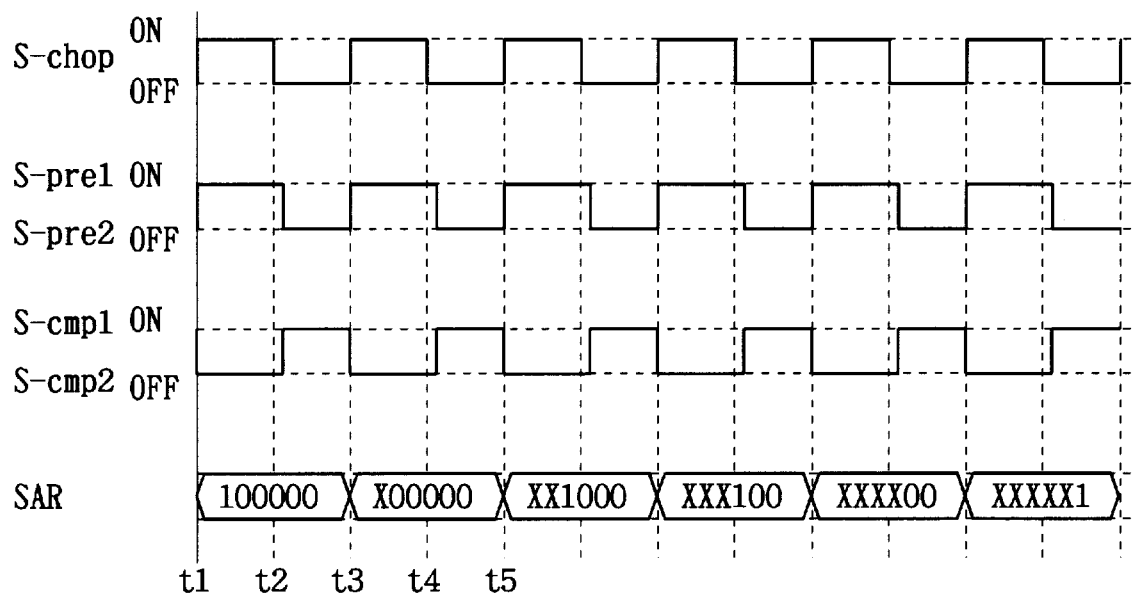
FIG. 18 is a timing chart for illustrating the operation of the conventional A-D converter.
Figure 19:
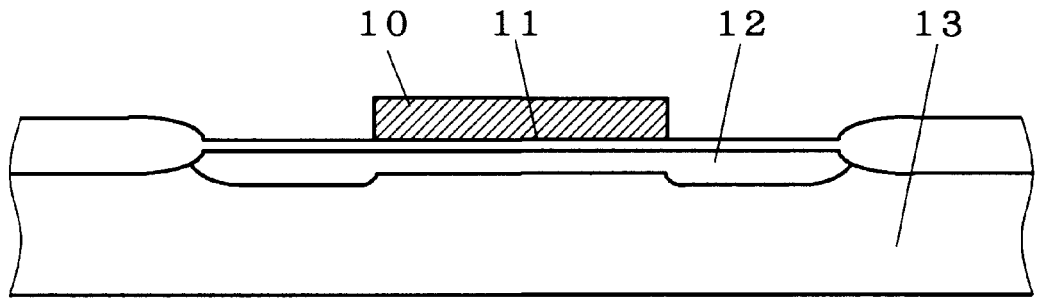
FIG. 19 is a chematic view showing the sectional structure of a MOS capacitor employed in the conventional A-D converter.
Figure 20:
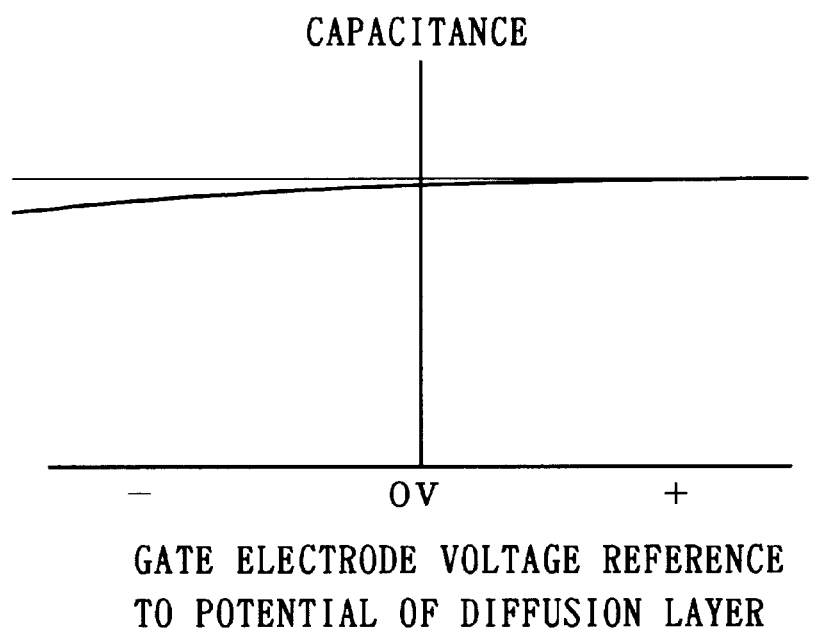
FIG. 20 is a graph showing an exemplary capacitance-bias voltage characteristic in the MOS capacitor shown in FIG. 19.
Figure 21:
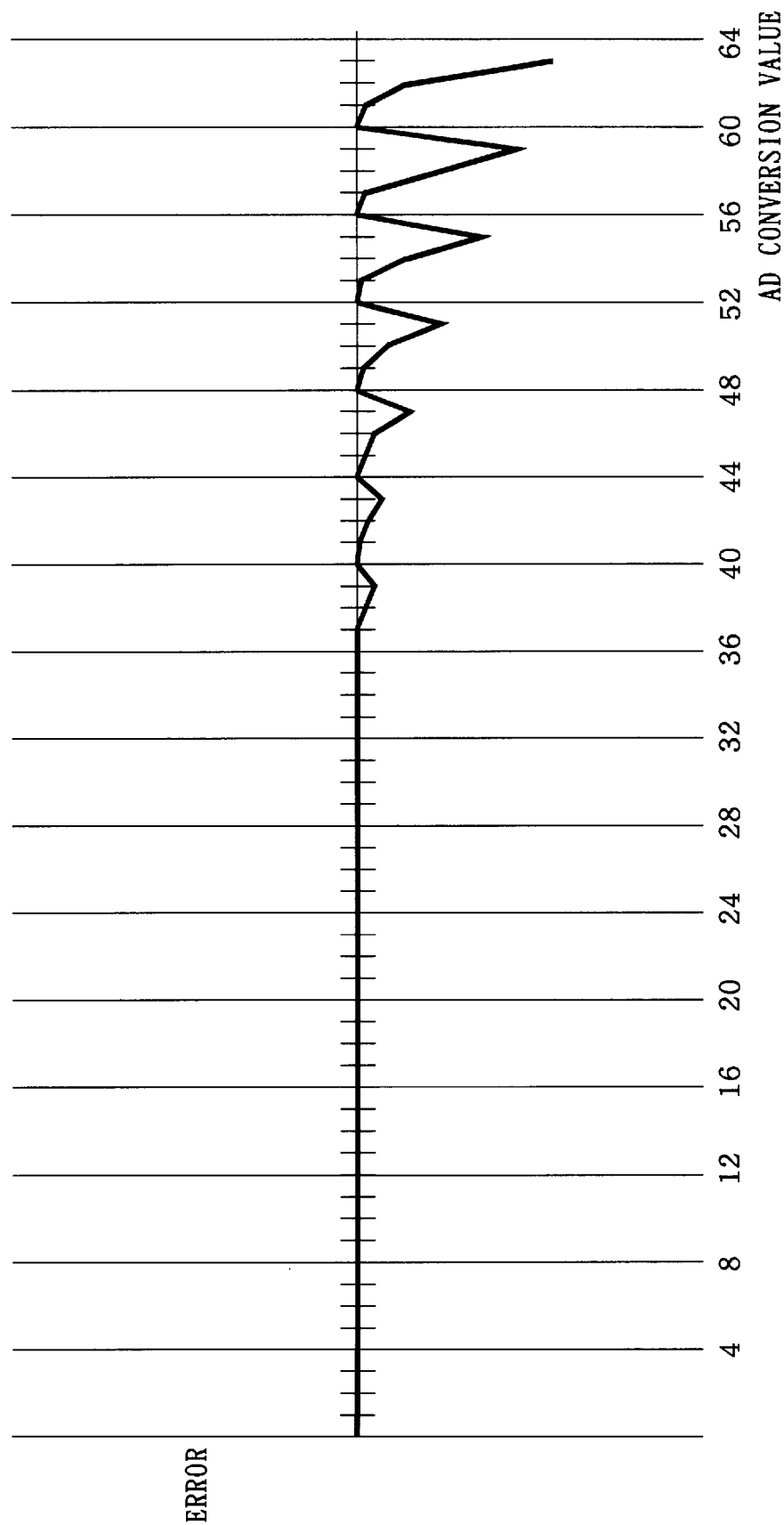
FIG. 21 is a graph showing the A-D conversion error characteristic of the conventional A-D converter.

FIG. 1 is a block diagram schematically showing the structure of an A-D converter 1A according to an embodiment 1 of the present invention. Referring to FIG. 1, a series-connected body 6A is formed by MOS capacitors C1A and C2A whose mutual capacitance ratio is adjustable. The remaining elements of the A-D converter 1A corresponding to those shown in FIG. 16 are denoted by the same reference numerals.

The plurality of MOS capacitors C1A and C2A shown in FIG. 1 are so formed that the capacitance of at least one of the same is changeable for adjusting he capacitance ratio therebetween. While FIG. 1 illustrates the MOS capacitors C1A and C2A whose capacitances are changeable in the A-D converter 1A, the capacitance of either capacitor C1A or C2A may alternatively be fixed. The MOS capacitors C1A and C2A shown in FIG. 1 change the capacitance of at least one of MOS capacitors C1 and C2, in order to compensate for change of the capacitance ratio therebetween caused by voltages applied thereto. The capacitance may be changed either once or a plurality of times.

Figure 2:
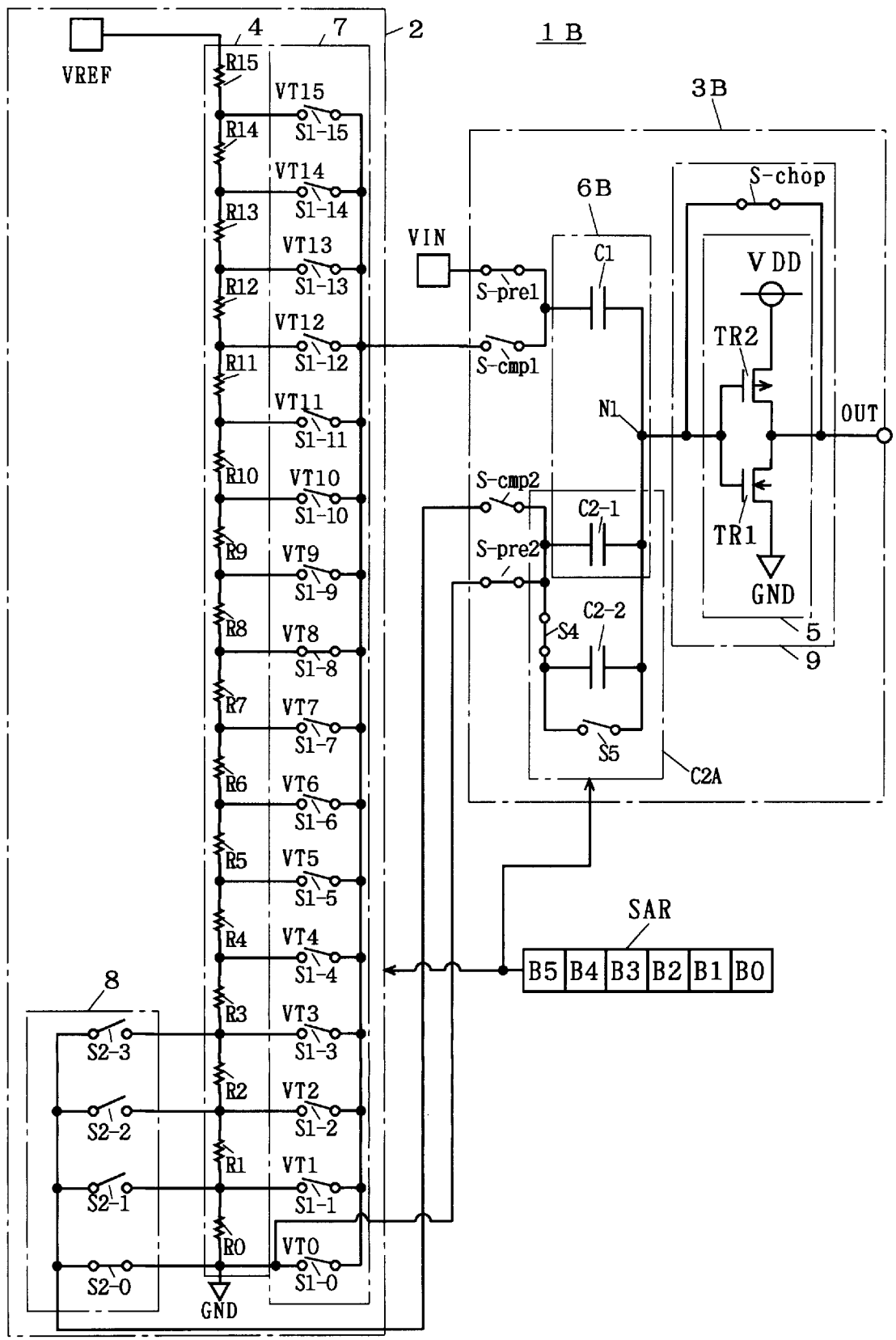
FIG. 2 is a circuit diagram showing a first mode of the A-D converter according to the embodiment 1.

FIG. 2 is a circuit diagram showing a first mode of the A-D converter according to the embodiment 1. In this A-D converter 1B, the sum of the capacitances of MOS capacitors C2-1 and C2-2 which are connected in parallel with each other is ¼ the capacitance of a MOS capacitor C1 when measured with application of the same bias voltage. The MOS capacitor C2-2 serves as an adjusting capacitor for adjusting the capacitance of a series-connected body 6B. The capacitance of the MOS capacitor C2-1 is ¼ the capacitance of the MOS capacitor C1 when measured with application of a voltage corresponding to ¹⁵/₁₆ a reference voltage VREF to a first electrode (diffusion region) of the MOS capacitor C1.

Switches S4 and S5 connect the MOS capacitor C2-2 in parallel with the MOS capacitor C2-1 or disconnect the former from the latter. Operations of the switches S4 and S5 are set in states shown in Table 3 in response to the values of bits B5 to B2 of a sequential approximate register SAR.

TABLE 3

| B5 | B4 | B3 | B2 | S4, S11-1, S11-2 | S5, S12-1, S12-2 |
|----|----|----|----|------------------|------------------|
| 0  | 0  | 0  | 0  | ON               | OFF              |
| 0  | 0  | 0  | 1  | ON               | OFF              |
| 0  | 0  | 1  | 0  | ON               | OFF              |
| 0  | 0  | 1  | 1  | ON               | OFF              |
| 0  | 1  | 0  | 0  | ON               | OFF              |
| 0  | 1  | 0  | 1  | ON               | OFF              |
| 0  | 1  | 1  | 0  | ON               | OFF              |
| 0  | 1  | 1  | 1  | ON               | OFF              |
| 1  | 0  | 0  | 0  | ON               | OFF              |
| 1  | 0  | 0  | 1  | ON               | OFF              |
| 1  | 0  | 1  | 0  | ON               | OFF              |
| 1  | 0  | 1  | 1  | ON               | OFF              |
| 1  | 1  | 0  | 0  | OFF              | ON               |
| 1  | 1  | 0  | 1  | OFF              | ON               |
| 1  | 1  | 1  | 0  | OFF              | ON               |
| 1  | 1  | 1  | 1  | OFF              | ON               |

The operation of the A-D converter 1B is identical to that of the A-D converter 1 shown in FIG. 16, except opening/closing of the switches S4 and S5. The operation for opening/closing the switches S4 and S5 is now described. When the voltage of an analog signal VIN is not more than 47/64 the reference voltage VREF, the A-D converter 1B closes and opens the switches S4 and S5 respectively, thereby connecting the MOS capacitors C2-1 and C2-2 in parallel with each other. The composite capacitance of the MOS capacitors C2-1 and C2-2 equal to the capacitance of the MOS capacitor C2 shown in FIG. 16. Also in the A-D converter 1B, the MOS capacitor C1 causes no capacitance change to result in no errors depending on the bias voltage for the MOS capacitor C1 if the voltage applied to the first electrode of the MOS capacitor C1 is not more than 47/64 the reference voltage VREF.

If the voltage of the analog signal VIN is larger than 47/64 the reference voltage VREF, on the other hand, the A-D converter 1B opens the switch S4 and closes the switch S5, thereby serially connecting only the MOS capacitor C2-1 to the MOS capacitor C1. The MOS capacitor C1 is so set that its capacitance is four times that of the MOS capacitor C2-1 when the voltage applied to the first electrode (diffusion region) of the MOS capacitor C1 is 15/16 the reference voltage VREF, whereby A-D conversion errors are minimized when the A-D converter 1B closes a switch S1-15 of a first switch group 7.

Figure 3:
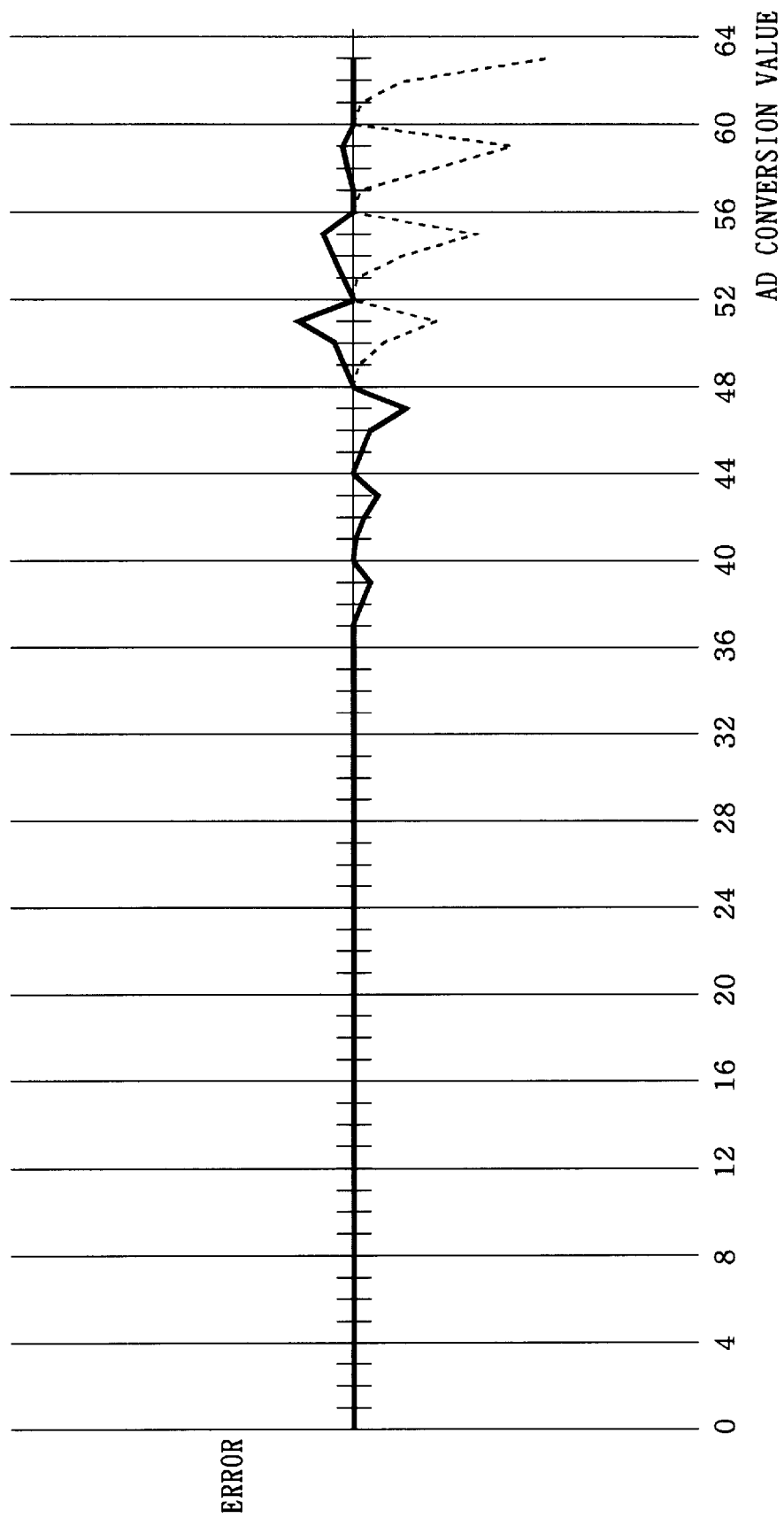
FIG. 3 is a graph showing the characteristic of errors caused by capacitance change of a MOS capacitor in the A-D converter shown in FIG. 2.

Therefore, errors are substantially zeroed when the voltage of the analog signal VIN is in excess of 60/64 the reference voltage VREF. If the voltage of the analog signal VIN is not more than 60/64 the reference voltage VREF, the capacitance of the MOS capacitor C2-1 is not more than ¼ that of the MOS capacitor C1 and hence errors take place with reverse signs to those caused when the voltage of the analog signal VIN is around 47/64 the reference voltage VREF. FIG. 3 is a graph showing errors caused when the A-D converter 1B operates in accordance with the rule shown in Table 3 in a solid line. FIG. 3 also shows errors caused in the A-D converter 1 shown in FIG. 16 in a dotted line.

While the A-D converter 1B employs two MOS capacitors C2-1 and C2-2 and adjusts the capacitance of the MOS capacitor C2-1 or C2-2 serially connected to the MOS capacitor C1 by selecting connection/disconnection thereof, the MOS capacitor serially connected to the MOS capacitor C1 may be divided into at least three. A-D conversion errors can be further reduced by employing capacitances of MOS capacitors divided into at least three and further finely adjusting a voltage generated by a voltage generating circuit 2 with data of the sequential approximate register SAR.

Figure 4:
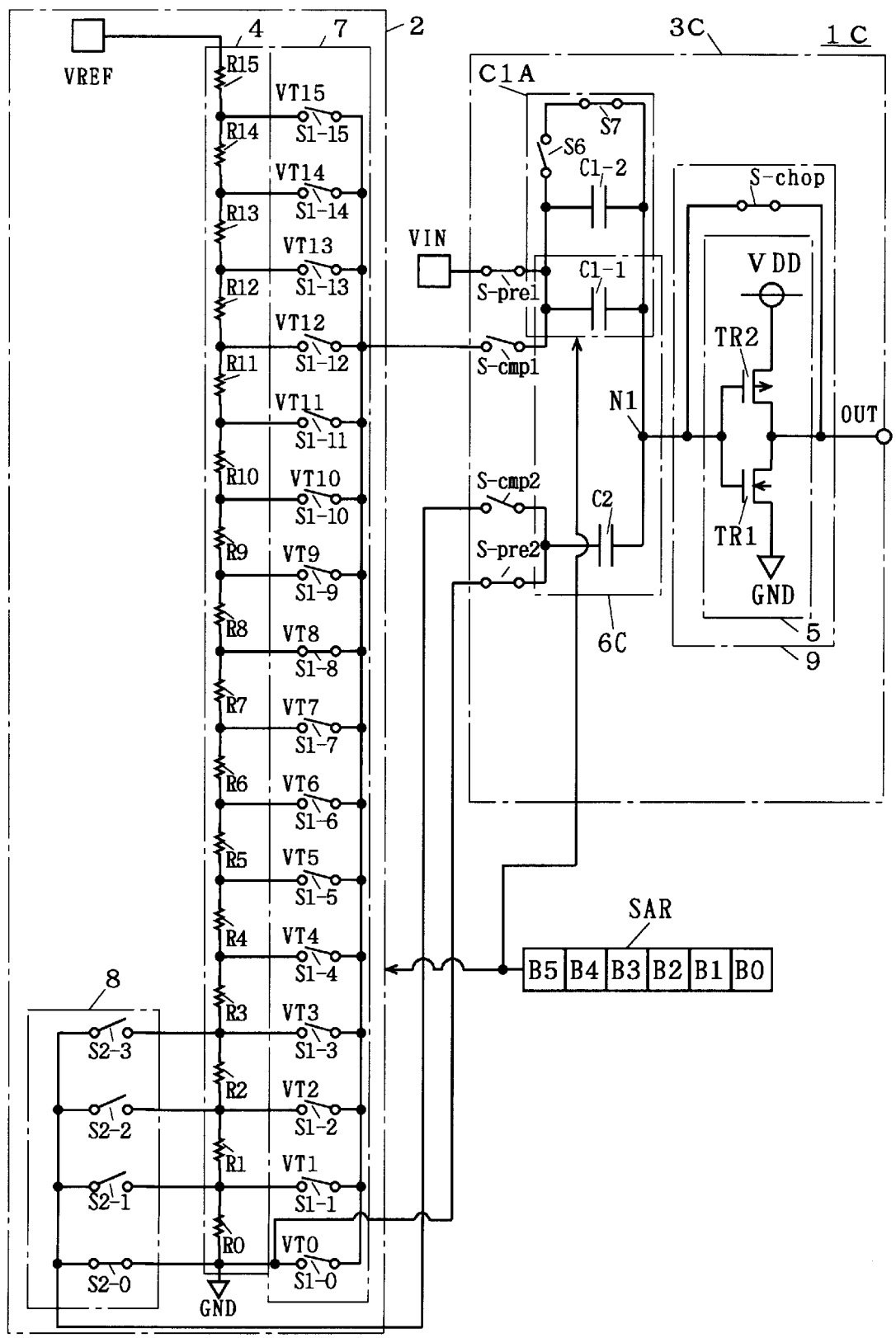
FIG. 4 is a circuit diagram showing a second mode of the A-D converter according to the embodiment 1.

While only the capacitance of the MOS capacitor C2A in the A-D converter 1A shown in FIG. 1 is changed in the first mode, the capacitance of a MOS capacitor C1A may alternatively be changed as shown in FIG. 4, or the capacitances of both MOS capacitors C1A and C2A may be changed. A-D conversion errors can be reduced by canceling capacitance change of any MOS capacitor caused by a voltage applied thereto. In an A-D converter 1C shown in FIG. 4, the MOS capacitor C1A having the changeable capacitance is formed by a switch S6, MOS capacitors C1-12 and C1-2 connected in parallel with each other when the switch S6 is closed, and a switch S7 connecting both electrodes of the MOS capacitor C1-2 when the switch S6 is open. This MOS capacitor C1-2 serves as an adjusting capacitor for adjusting the capacitance of a series-connected body 6C.

The MOS capacitor C1-1 of the A-D converter 1C has a capacitance four times that of a MOS capacitor C2 when measured with application of the same bias voltage. Further, the capacitance of a MOS capacitor C1A is four times that of the MOS capacitor C2 when measured with application of a voltage corresponding to 15/16 a reference voltage VREF to a first electrode (diffusion region) of the MOS capacitor C1A while connecting the MOS capacitors C1-1 and C1-2 in parallel with each other.

Embodiment 2

Figure 5:
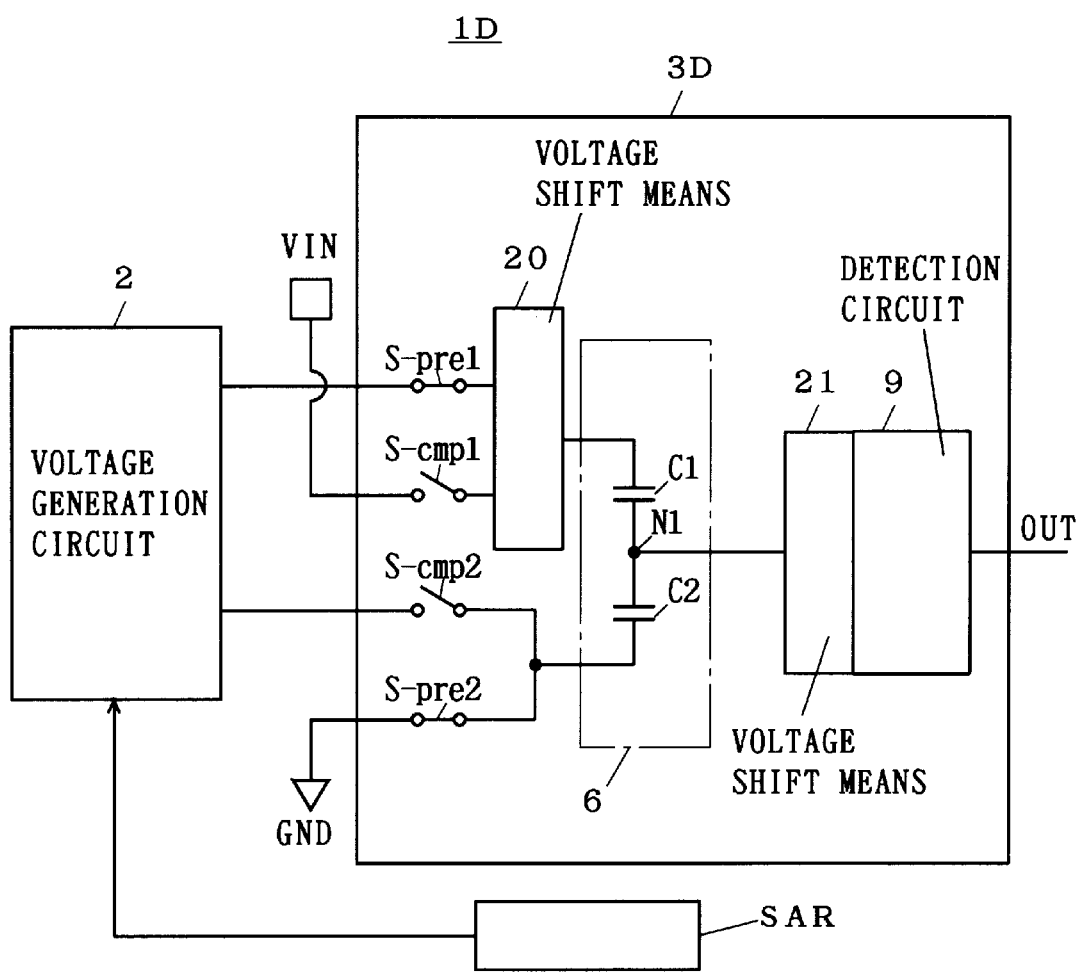
FIG. 5 is a block diagram schematically showing the structure of an A-D converter according to an embodiment 2 of the present invention.

An A-D converter 1D according to an embodiment 2 of the present invention is now described with reference to FIG. 5. FIG. 5 is a block diagram schematically showing the structure of the A-D converter 1D according to the embodiment 2 of the present invention. In the A-D converter 1D shown in FIG. 5, a compare circuit 3D is improved. This compare circuit 3D comprises voltage shift circuit 20 or 21 on at least one of first and second electrodes of a MOS capacitor C1. As to the remaining structure of the A-D converter 1D, parts denoted by the same reference numerals as those in FIG. 16 correspond to those of the A-D converter 1 shown in FIG. 16.

The voltage shift circuit 20 of the A-D converter 1D regularly reduces a voltage inputted through a switch S-pre1 or S-cmp1 by a constant value and applies the same to the first electrode of the MOS capacitor C1. The voltage shift circuit 21 of the A-D converter 1D regularly increases a precharge voltage applied to the second electrode of the MOS capacitor C1 from a detection circuit 9 in precharging by a constant value a. Further, the voltage shift circuit 21 regularly reduces the voltage of the second electrode of the MOS capacitor C1 by the constant value α and supplies the same to the detection circuit 9 in comparison. Namely, the voltage shift circuit 21 increases a threshold voltage detected by the detection circuit 9 by the constant value α.

The A-D converter 1D comprises at least one of the voltage shift circuit 20 for reducing the voltage of the first electrode of the MOS capacitor C1 and the voltage shift circuit 21 for increasing the voltage of the second electrode of the MOS capacitor C1. Therefore, the A-D converter 1D can reduce the voltage applied between the electrodes of the MOS capacitor C1 for suppressing capacitance change of the MOS capacitor C1, thereby reducing A-D conversion errors. In order to increase or reduce the voltages of the first and second electrodes of the MOS capacitor C1, the voltage shift circuit 20 and/or 21 must shift the voltages by the same magnitude in both of precharging and comparison.

Figure 6:
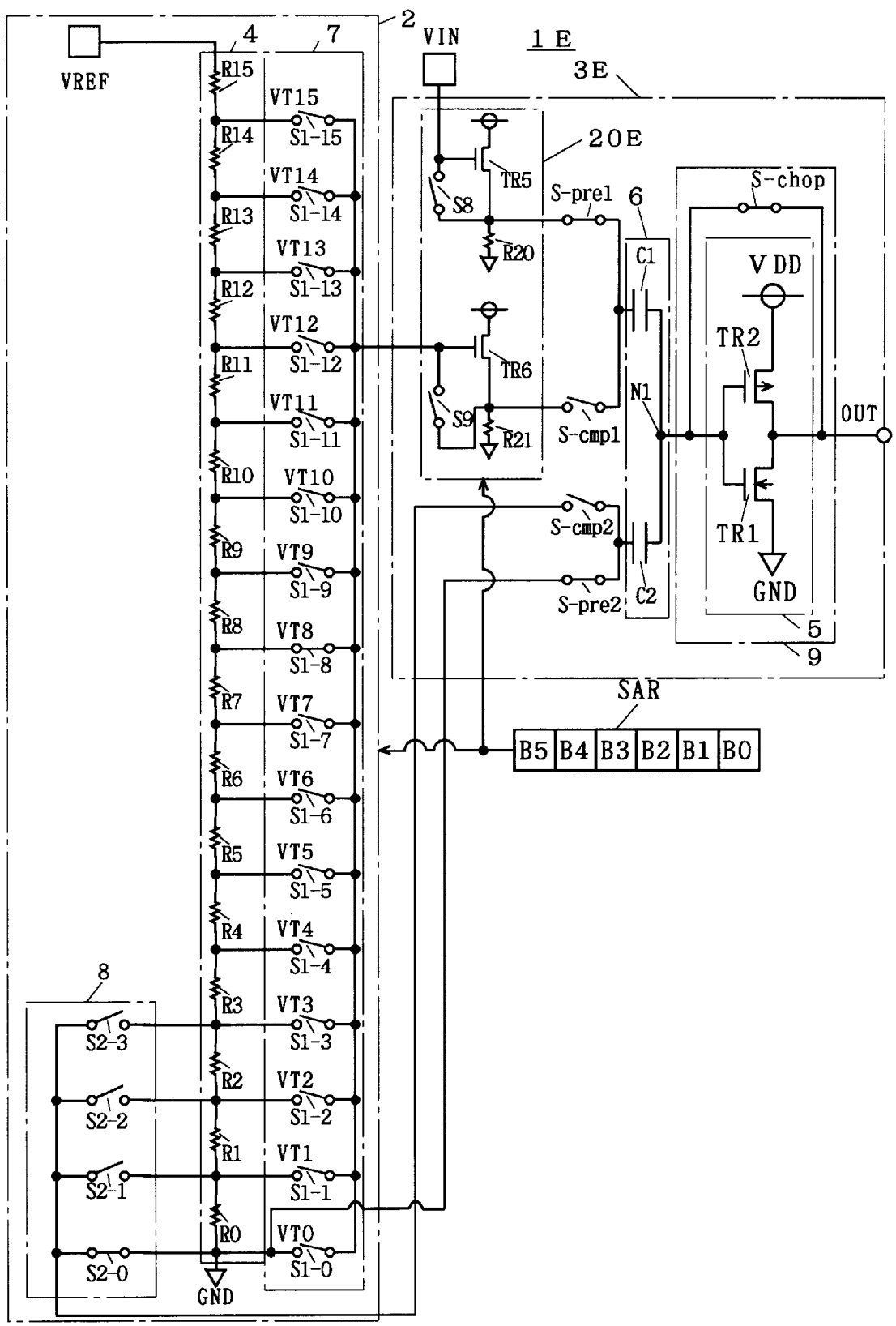
FIG. 6 is a circuit diagram showing a first mode of the structure of the A-D converter according to the embodiment 2.

The structure for reducing the voltage of the first electrode of the MOS capacitor C1 is now described with reference to FIG. 6. FIG. 6 is a circuit diagram showing a first mode of the structure of the A-D converter according to the embodiment 2. An A-D converter 1E shown in FIG. 6 comprises a voltage shift circuit 20E in a front stage of switches S-pre1 and S-cmp1. This voltage shift circuit 20E, which is provided in the front stage of the switches S-pre1 and S-cmp1, may alternatively be provided in a rear stage of the switches S-pre1 and S-cmp1, similarly to the voltage shift circuit 20 shown in FIG. 5. The voltage shift circuit 20E comprises switches S8 and S9 for selecting whether or not an analog signal VIN and a first reference voltage (selected by a first switch group 7) are shifted and transistors TR5 and TR6 and resistances R20 and R21 for shifting the analog signal VIN and the first reference voltage. The remaining structure of the A-D converter 1E is identical to that of the A-D converter 1 shown in FIG. 16, except the voltage shift circuit 20E.

When the voltage of the analog signal VIN is in excess of VREF/2, for example, the A-D converter 1E selects a state of shifting the voltages by the transistors TR5 and TR6 and applying the analog signal VIN and the first reference voltage to a first electrode of a MOS capacitor C1. The A-D converter 1E is set to subtract 15% of the reference voltage VREF from the voltage of the analog signal VIN, for example. When the voltages of the first electrodes of the MOS capacitors C1 shown in FIGS. 16 and 6 equal to each other in this case, difference of 12 takes place between the values of the sequential approximate registers SAR. Under such condition, the error characteristic of the A-D converter 1E is shifted rightward by 12 in A-D conversion value as shown by a solid line in FIG. 7, as compared with the error characteristic of the A-D converter 1 shown by a dotted line. Thus, errors of the A-D converter 1E are reduced.

In order to perform such shifting, it is necessary to revise the rule of selection of the first switch group 7. In case of subtracting 15% of the reference voltage VREF, a switch having a subscript smaller than that of the switch of the first switch group 7 selected by the A-D converter 1 shown in FIG. 16 by three must be selected. When the analog signal VIN for selecting the switch S1-13 is inputted in the A-D converter 1, for example, the A-D converter 1E selects a switch S1-10. The A-D converter 1E performs an operation similar to that of the A-D converter 1 if the voltage of the analog signal VIN is not in excess of VREF/2.

Figure 8:
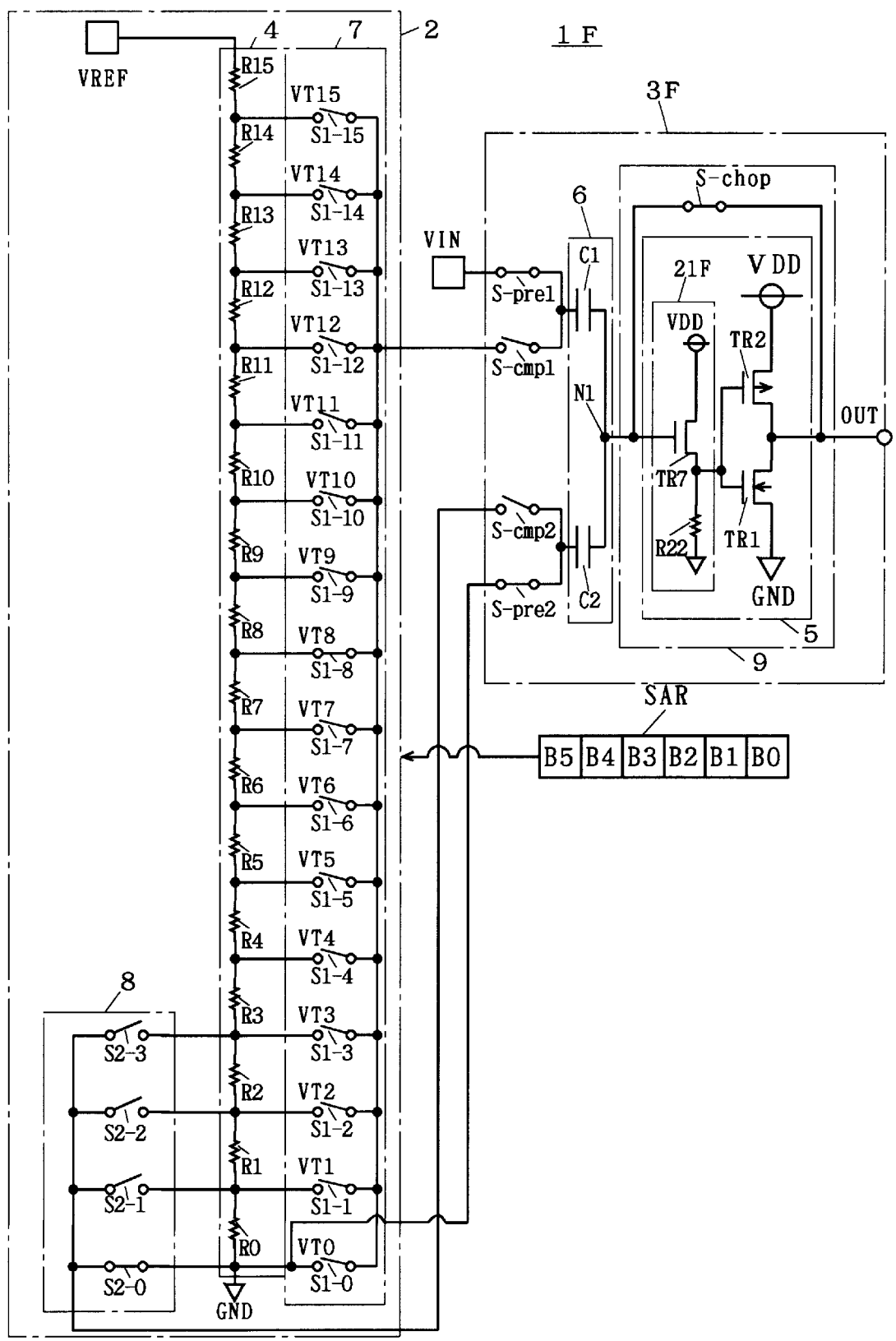
FIG. 8 is a circuit diagram showing a second mode of the structure of the A-D converter according to the embodiment 2.

FIG. 8 shows a mode of an A-D converter 1F comprising voltage shift circuit for increasing the voltage of a second electrode of a MOS capacitor C1. The A-D converter 1F shown in FIG. 8 is different from the A-D converter 1 shown in FIG. 16 in a point that a voltage shift circuit 21F is provided in a front stage of a CMOS inverter 5. The voltage shift circuit 21F is formed by a MOS transistor TR7 having a source to which a power supply voltage VDD is applied from a power source, a gate connected to a node N1 between MOS capacitors C1 and C2 and a drain connected to an input terminal of the CMOS inverter 5 and a resistance R22 connected between the drain of the MOS transistor TR7 and a wire supplying a ground voltage GND. The structure of the A-D converter 1F is identical to that of the A-D converter 1 shown in FIG. 16, except that the voltage shift circuit 21F is inserted between the node N1 and the input terminal of the CMOS inverter 5.

When the voltage of an analog signal VIN is in excess of VREF/2, for example, the A-D converter 1F shifts the voltage by the transistor TR7 in a direction for increasing a precharge voltage and a threshold voltage. The A-D converter 1F increases the precharge voltage and the threshold voltage by 15% for setting the same at VREF×0.65, for example. In this case, difference of 12 takes place between the values of the sequential approximate registers SAR when the voltages of the second electrodes of the MOS capacitors C1 shown in FIGS. 16 and 6 equal to each other. Under such condition, the A-D converter 1F has the error characteristic shown by the solid line in FIG. 7, and is improved similarly to the A-D converter 1E.

Figure 9:
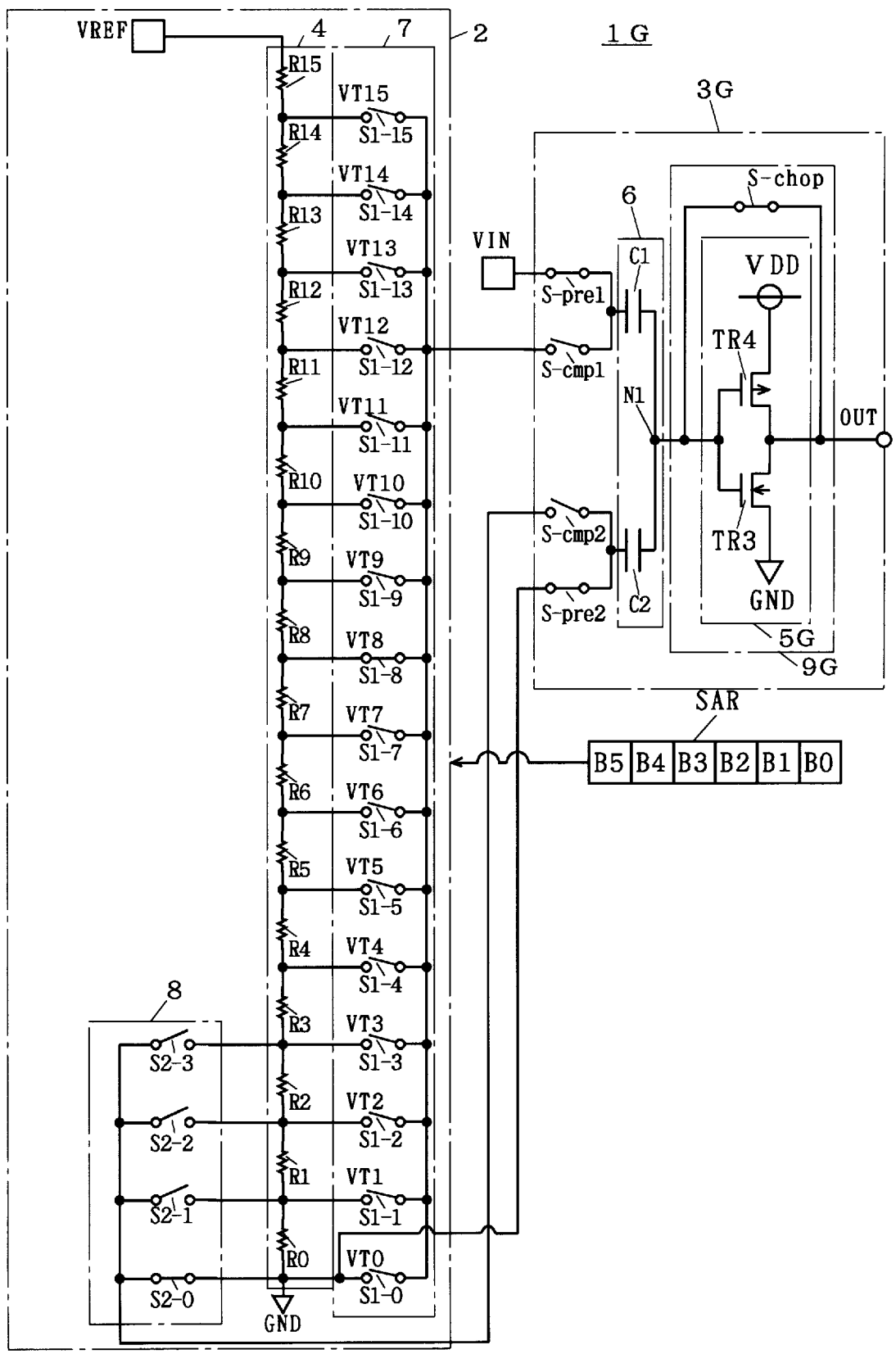
FIG. 9 is a circuit diagram showing a third mode of the structure of the A-D converter according to the embodiment 2.

FIG. 9 shows a third mode of an A-D converter 1G comprising voltage shift circuit for increasing the voltage of a second electrode of a MOS capacitor C1. The A-D converter 1G shown in FIG. 9 is different from the A-D converter 1 shown in FIG. 16 in structures of transistors TR3 and TR4 of a CMOS inverter 5G. While the voltage shift circuit 21F and the CMOS inverter 5 increase the precharge voltage and the threshold voltage in the A-D converter 1F shown in FIG. 8, the CMOS inverter 5G shown in FIG. 9 serves as shift means having both functions of the voltage shift circuit 21F and the CMOS inverter 5.

Figure 10:
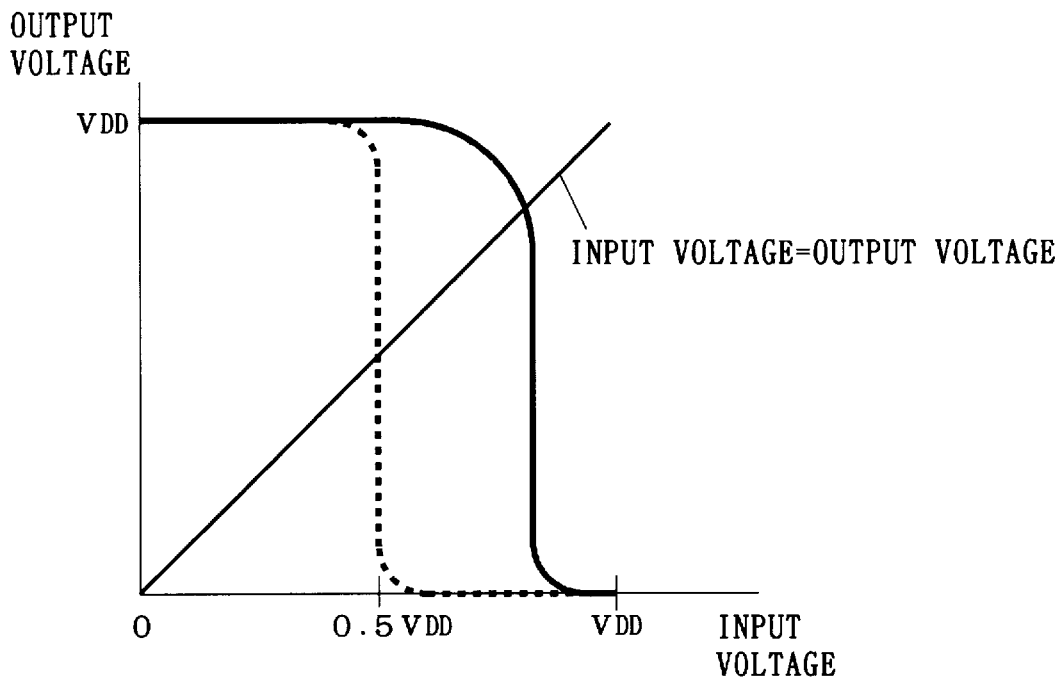
FIG. 10 is a graph showing the input/output characteristic of a CMOS inverter of the A-D converter shown in FIG. 9.

Therefore, the MOS transistor amplification factor (β: MOS transistor gain factor) of the transistor TR4 is set at twice that of the transistor TR3 or more, for example, in order to attain a sufficient effect. A threshold voltage VTH2 of the CMOS inverter 5G formed by such transistors TR3 and TR4 is shifted toward a power supply voltage VDD, as shown in FIG. 10. FIG. 10 shows the input/output characteristic of the CMOS inverter 5G in a solid line. The conventional CMOS inverter 5 shown in FIG. 16 is formed by the transistors TR1 and TR2 having the same MOS transistor gain factor β, and the threshold voltage VTH1 of the conventional CMOS inverter 5 is 0.5 VDD, as shown by a dotted line in FIG. 10.

The reason why the accuracy of the A-D converter 1G shown in FIG. 9 is improved as compared with that of the A-D converter 1 shown in FIG. 16 is now described. To this end, states of compare operations of the A-D converters 1G and 1 shown in FIGS. 9 and 16 are studied. In case of performing the compare operation, an input voltage in the CMOS inverter 5G shown in FIG. 9 equals to that n the CMOS inverter 5 shown in FIG. 16 when the value of a sequential approximate register SAR of the A-D converter 1G shown in FIG. 9 is larger by {80×(VTH2−VTH1) NVREF} than that of the A-D converter 1 shown in FIG. 16.

Figure 7:
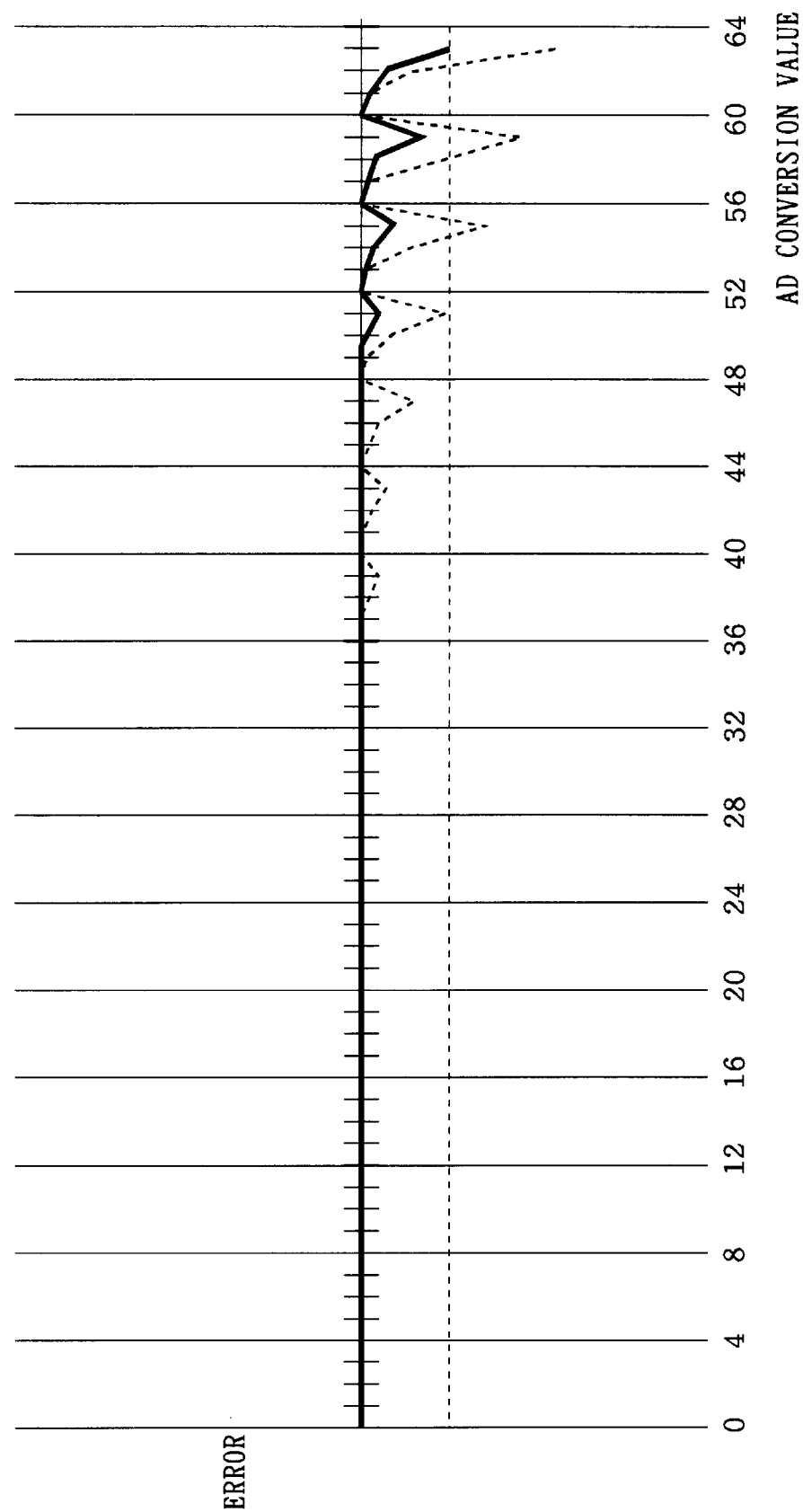
FIG. 7 is a graph showing the characteristic of A-D conversion errors caused by capacitance change of a MOS capacitor in the A-D converter shown in FIG. 6.

If the threshold voltage VTH2 of the CMOS inverter 5G is set at (VTH1+VREF×0.15), for example, difference of 12 takes place between the values of the sequential approximate registers SAR when the input voltages of the CMOS inverters 5 and 5G equal to each other. Under such condition the error characteristic of the A-D converter 1G shown in FIG. 9 is improved similarly to that of the A-D converter 1F shown in FIG. 8, as shown in FIG. 7.

According to the A-D converter 1G of the third mode of the embodiment 2, as hereinabove described, deterioration of A-D conversion accuracy caused by the bias voltage dependence of the capacitance of the MOS capacitor C1 can be reduced by increasing the threshold voltage of a detection circuit 9G. Comparing the structure of the A-D converter 1G shown in FIG. 9 with that shown in FIG. 16, merely the characteristics of transistors forming the inverter 5G are changed and deterioration of the A-D conversion accuracy can be reduced by such simple change.

While the threshold value of the CMOS inverter 5G is increased in order to increase the threshold voltage of the detection circuit 9G in the third mode of the embodiment 2, a similar effect can be attained also in still another mode by increasing the threshold voltage of the detection circuit 9G as well as the precharge voltage on the node N1 between the MOS capacitors C1 and C2. For example, the threshold voltage of the CMOS inverter 5 may be increased by changing a power supply voltage for driving the CMOS inverter 5.

Embodiment 3

Figure 11:
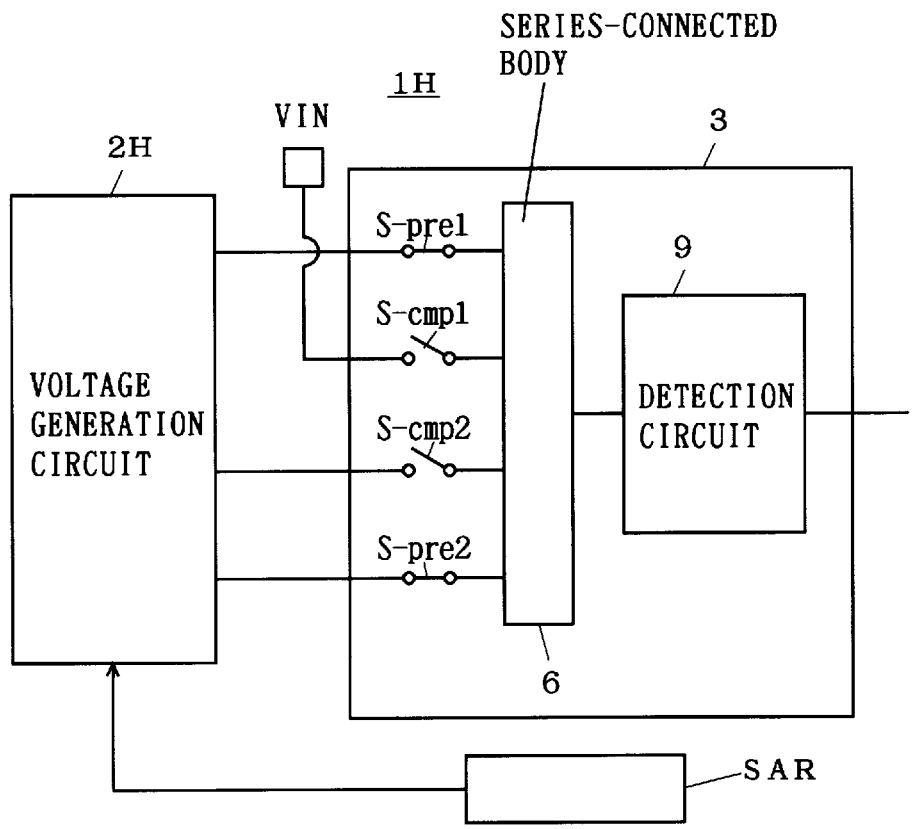
FIG. 11 is a block diagram schematically showing the structure of an A-D converter according to an embodiment 3 of the present invention.

FIG. 11 is a block diagram schematically showing the structure of an A-D converter 1H according to an embodiment 3 of the present invention. Referring to FIG. 11, numeral 2H denotes a voltage generating circuit, while numerals identical to those in FIG. 16 denote parts corresponding to those of the A-D converter 1. The voltage generating circuit 2H shown in FIG. 11 is different from the voltage generating circuit 2 of FIG. 16 in a point that the former supplies a voltage also to a switch S-pre2 while the latter supplies the reference voltage only to the switches S-cmp1 and S-cmp2. Namely, the voltage generating circuit 2H shown in FIG. 11 generates the voltage applied to the switch S-pre2 so that bias voltages for MOS capacitors C1 and C2 approach to each other. In case of selecting such a voltage that a first reference voltage applied to a switch S-cmp1 is continuously changed and the potential difference between the switches S-cmp1 and S-pre2 is in excess of a prescribed value, for example, the voltage generating circuit 2H changes the voltage applied to the switch S-pre2 to reduce the potential difference between the voltage applied to the switch S-pre2 and the voltage of the switch S-cmp1. Therefore, the A-D converter 1H increases voltages applied to a first electrode of the MOS capacitor C2, i.e., a second reference voltage and a prescribed voltage.

It is possible to change the capacitance of the MOS capacitor C2 in dependence on a bias voltage by setting the voltages applied to the switches S-cmp1 and S-pre1 so that the difference therebetween is not in excess of a prescribed value, thereby reducing change of a voltage on a node caused by change of the capacitance of the MOS capacitor C1 in dependence on the bias voltage. Thus, the amount of changes stored in the MOS capacitors C1 and C2 can be adjusted by reducing fluctuation of the capacitance ratio between the MOS capacitors C1 and C2, thereby correcting a voltage generated in a series-connected body 6 and reducing A-D conversion errors.

Figure 12:
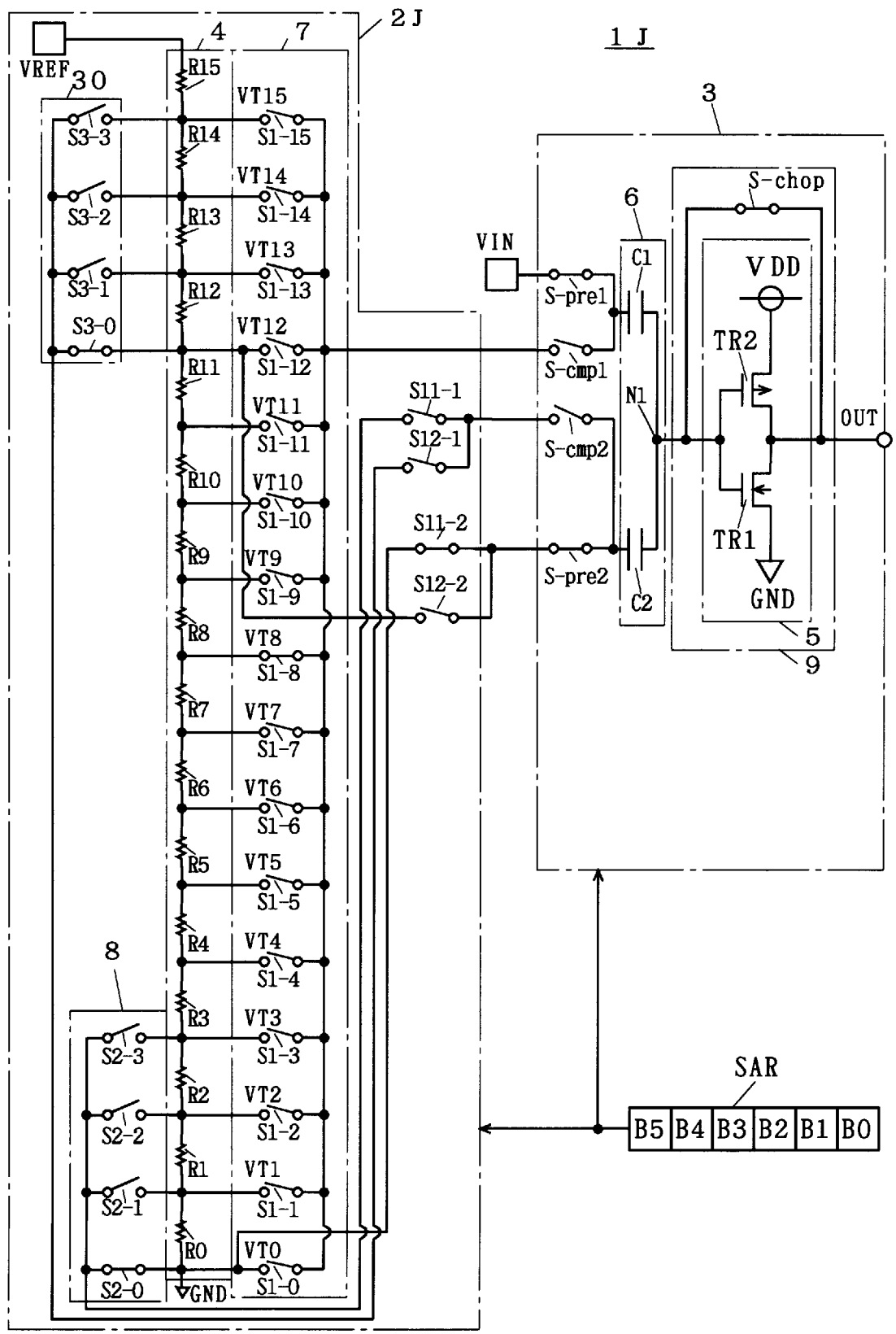
FIG. 12 is a circuit diagram showing a first mode of the A-D converter according to the embodiment 3.

FIG. 12 is a circuit diagram showing a first mode of the A-D converter according to the embodiment 3. Referring to FIG. 12, numeral 30 denotes a third switch group formed by switches S3-0 to S3-3 for selecting reference voltages VT12 to VT15 generated in a resistive ladder network 4, symbols S11-1 and S12-1 denote switches for switching voltages applied to a switch S-cmp2, and symbols S11-12 and S12-2 denote switches for switching voltages applied to a switch S-pre2. The structures of and connection between the resistive ladder network 4 and the first and second switch groups 7 and 8 forming a voltage generating circuit 2J are identical to those of the voltage generating circuit 2 shown in FIG. 16.

Switching operations of the switches S3-0 to S3-3 of the third switch group 30, which are shown in Table 2, are identical to those of corresponding witches S2-0 to S2-3 of a second switch group 8 respectively. Voltages VT0 to VT3 selected by the switches S2-0 to S2-3 of the second switch group 8 or voltage VT12 to VT15 selected by the switches S3-0 to S3-3 of the third switch group 30 are applied to a first electrode of the MOS capacitor C2 through the switch S-cmp2.

Figure 13:
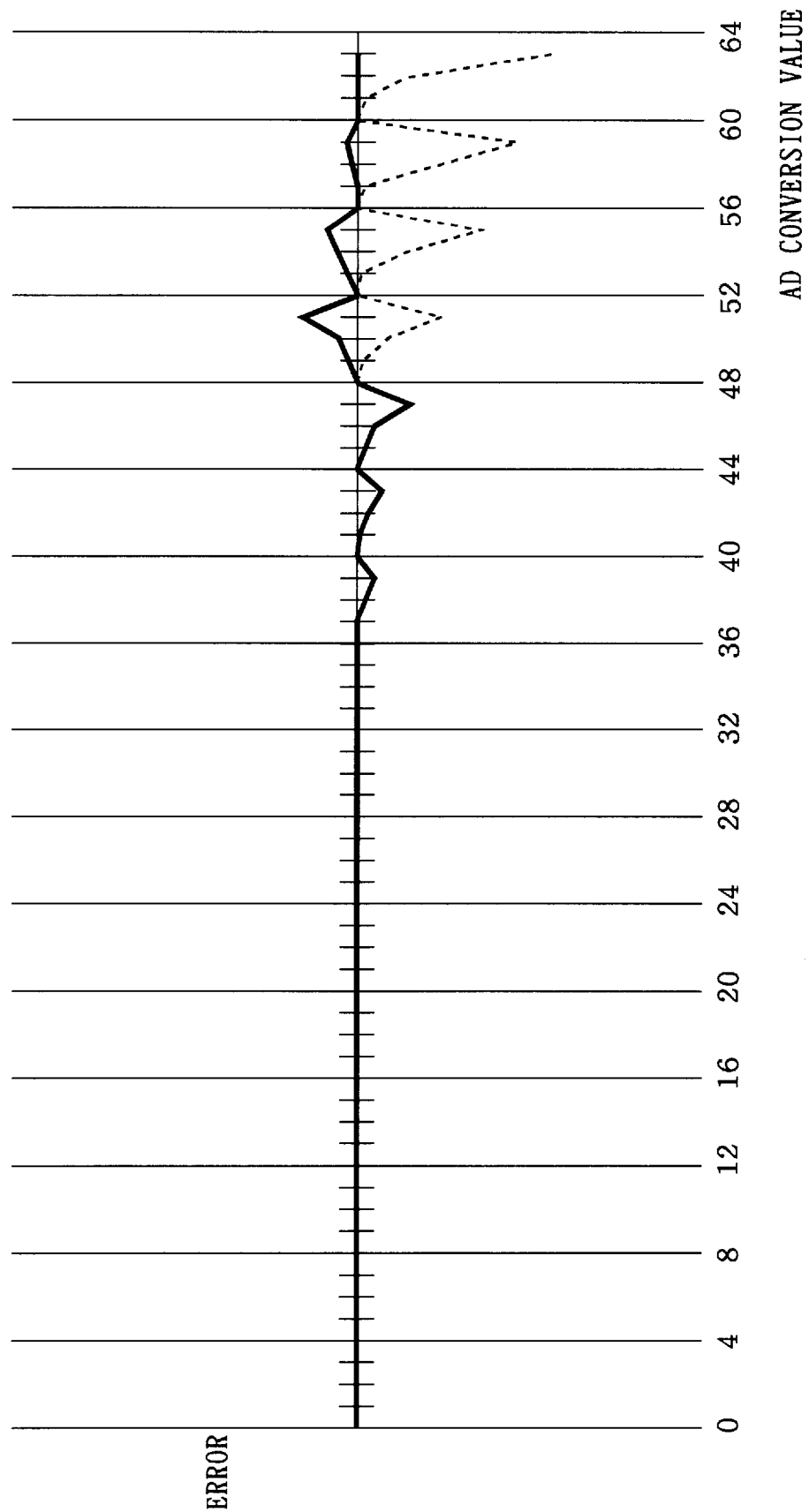
FIG. 13 is a graph showing the characteristic of A-D conversion errors caused by capacitance change of a MOS capacitor in the A-D converter shown in FIG. 12.

Switching operations of the switches S11-1, S11-2, S12-1 and S12-2 are shown in Table 3. When the voltage of an analog signal VIN is not more than 47/64 a reference voltage VREF, an A-D converter 1J regularly closes the switches S11-1 and S11-2 while opening the switches S12-1 and S12-2. At this time, the A-D converter 1J is equivalent to the A-D converter 1 shown in FIG. 16, with A-D conversion errors identical to those of the A-D converter 1. When the voltage of the analog signal VIN is in excess of VREF×47/64, on the other hand, the A-D converter 1J opens the switches S11-1 and S11-2 while closing the switches S12-1 and S12-2. At this time, a second reference voltage having a value corresponding to 12/16 to 15/16 the reference voltage VREF is applied to the first electrode of the MOS capacitor C2 of the A-D converter 1J through the switches S-pre2 and S-cmp2. On the other hand, a first reference voltage having a value corresponding to 12/16 to 15/16 the reference voltage VREF is also applied to the MOS capacitor C1 of the A-D converter 1J through the switches S-pre1 and S-cmp2. Thus, the difference between the bias voltages for the MOS capacitors C1 and C2 is smaller than that in the A-D converter 1 shown in FIG. 16, whereby the capacitance ratio between the MOS capacitors C1 and C2 approaches to 4:1 and has a value closer compared with those in FIG. 16. When the voltage of the analog signal VIN is at a value obtained by multiplying the reference voltage VREF by 63/64, 58/64 or 53/64, in particular, the bias voltages of the MOS capacitors C1 and C2 equal to each other, whereby A-D conversion errors related to bias voltage dependence of the MOS capacitors C1 and C2 are theoretically zeroed. FIG. 13 is a graph showing the error characteristic of the A-D converter 1J. Referring to FIG. 13, it is understood that the error characteristic of the A-D converter 1J shown in a solid line is improved with respect to that of the A-D converter 1 shown in FIG. 16 shown by a dotted line.

Figure 14:
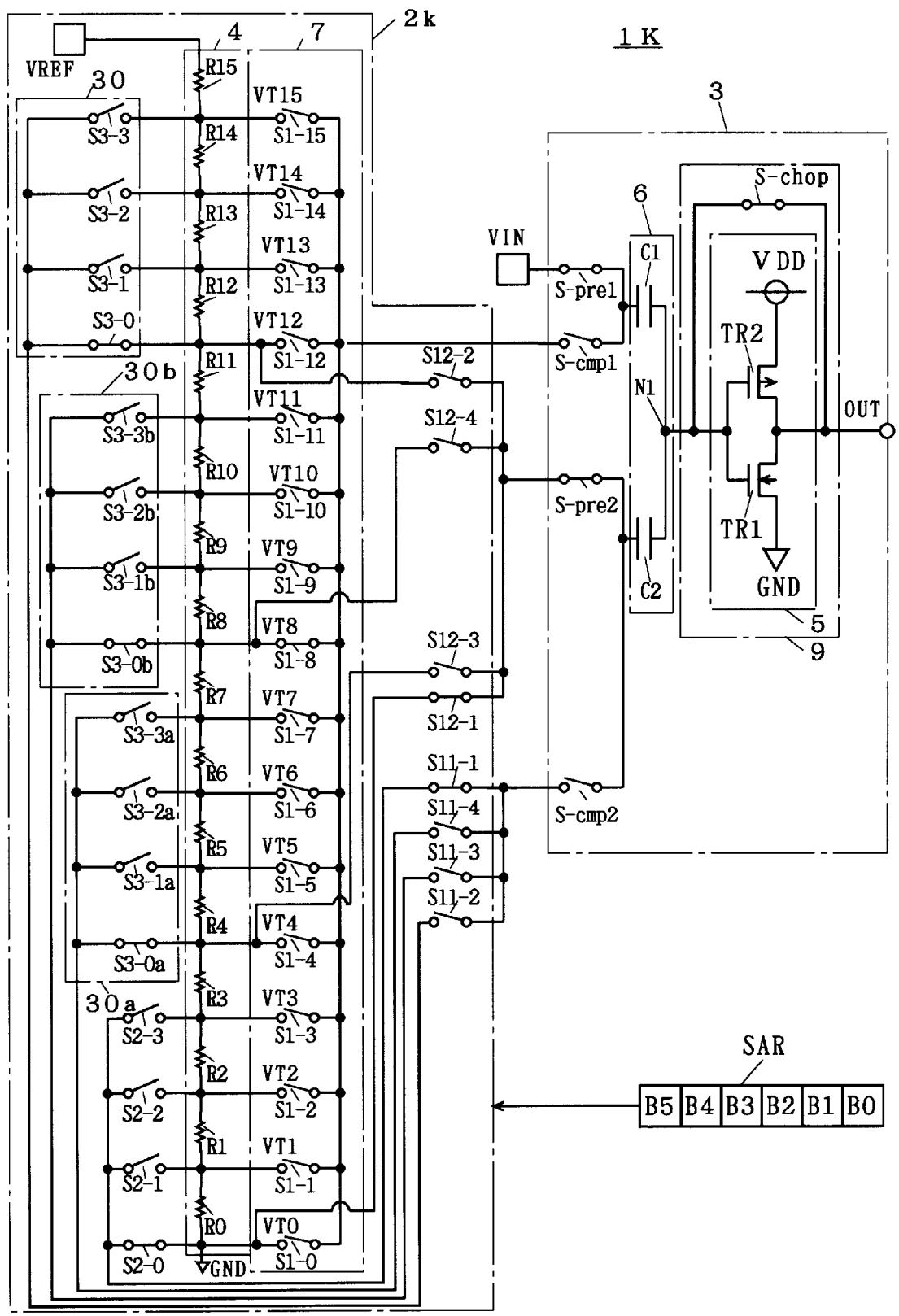
FIG. 14 is a circuit diagram showing a second mode of the A-D converter according to the embodiment 3.

FIG. 14 is a circuit diagram showing a second mode of the A-D converter according to the embodiment 3. While the A-D converter 1J shown in FIG. 12 prepares two types of second reference voltage groups and prescribed voltages respectively, an A-D converter 1K shown in FIG. 14 prepares four types of second reference voltage groups and prescribed voltages respectively. Third switch groups 3a and 30b as well as switches S12-3 and S12-4 for selecting the third switch groups 3a and 30b are added. Therefore, two sets of second reference voltages VT4 to VT7 and VT8 to VT11 can be newly selected to be applied to a first electrode of a MOS capacitor C2 through a switch S-cmp2. Further, switches S11-3 and S11-4 are added for selecting a prescribed voltage to be applied to the switch S-cmp2. Therefore, VT0 (GND), VT4, VT8 and VT12 can be selected as prescribed voltages applied to the first electrode of the MOS capacitor C2 through a switch S-pre2. Tables 4 and 5 show the relation between data of a sequential approximate register SAR and these operations.

TABLE 4

| B1 | B0 | closed switch |
|----|----|----|
| 0 | 0 | S2-0, S3-0, S3-0a, S3-0b |
| 0 | 1 | S2-1, S3-1, S3-1a, S3-1b |

TABLE 4-continued

| B1 | B0 | closed switch |
|----|----|--------------| 
| 1 | 0 | S2-2, S3-2, S3-2a, S3-2b |
| 1 | 1 | S2-3, S3-3, S3-3a, S3-3b |

TABLE 5

| B5 | B4 | S11-1, S12-1 | S11-2, S12-2 | S11-3, S12-3 | S11-4, S12-4 |
|----|----|---|---|---|---|
| 0 | 0 | ON | OFF | OFF | OFF |
| 0 | 1 | OFF | ON | OFF | OFF |
| 1 | 0 | OFF | OFF | ON | OFF |
| 1 | 1 | OFF | OFF | OFF | ON |

Thus, A-D conversion errors of the A-D converter 1K are improved as compared with the A-D converter 1J by adding the third switch groups 30a and 30b and performing fine control by the values of the sequential approximate register SAR.

The third switch groups 30, 30a and 30b according to the first and second modes of the embodiment 3 may select voltages other than those described above, and an effect can be attained when the voltages are so set that the bias voltages for the MOS capacitors C1 and C2 approach to each other.

Embodiment 4

Figure 15:
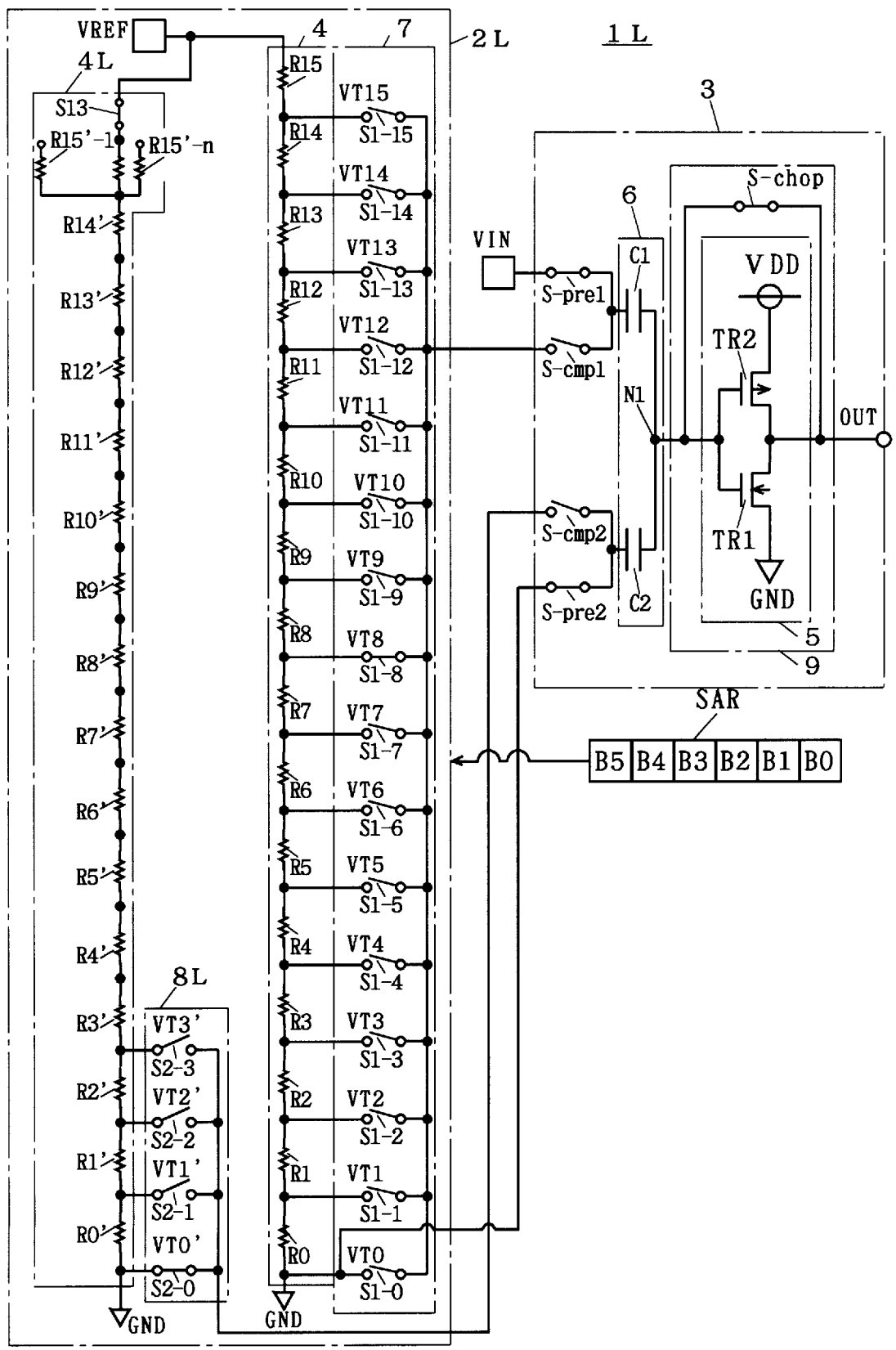
FIG. 15 is a circuit diagram showing a mode of an A-D converter according to an embodiment 4 of the present invention.

FIG. 15 is a circuit diagram showing a mode of an A-D converter 1L according to an embodiment 4 of the present invention. A voltage generating circuit 2L of the A-D converter 1L shown in FIG. 15 further comprises a resistive ladder network 4L, with respect to the A-D converter 1 shown in FIG. 16. While the A-D converter 1 selects the second reference voltage from the resistive ladder network 4 by the second switch group 8, the A-D converter 1J selects a second reference voltage from the resistive ladder network 4L by a second switch group 8L.

The resistive ladder network 4L is formed to select resistances R15'-1 to R15'-n by a switch S13, to be capable of changing the value of its composite resistance. The resistive ladder network 4L can change the values of second reference voltages VT1' to VT3' selected by the second switch group 8L by changing the value of the composite resistance. The second reference voltages VT1' to VT3' are changed to compensate for change of the amounts of charges stored in MOS capacitors C1 and C2 by bias voltage dependence thereof. Even if the capacitance ratio between the MOS capacitors C1 and C2 is changed, it is possible to correct a voltage generated in a series-connected body 6 for reducing A-D conversion errors by adjusting the amounts of charges stored in the MOS capacitors C1 and C2.

While the resistive ladder networks 4 to 4L are employed for the voltage generating circuits 2 to 2L in the aforementioned embodiments 1 to 4, the structure of the voltage generating circuit is not restricted to the above so far as the same may generate a plurality of first reference voltages and a plurality of second reference voltages as well as prescribed voltages as the case may be.

While the detection circuits 9 to 9G of the compare circuits 3 to 3G are formed by the CMOS inverters 5 to 5G in the aforementioned embodiments 1 to 4, the detection circuit is not restricted to the above structure but may be in another structure so far as the same can precharge a precharge voltage equal to the threshold voltage employed for the node N1 between the MOS capacitors C1 and C2 in comparison.

While the invention has been shown and described in detail, the following description is in all aspects illustrative and restrictive. It is therefore understood that numerous modifications and variations can be devised without departing from the scope of the invention.

I claim:

1. An A-D converter comprising:

a voltage generating circuit for generating first and second reference voltages with reference to a prescribed voltage; and a compare circuit having a series-connected body including a plurality of serially interconnected MOS capacitors and having first and second ends for applying an analog signal and said prescribed voltage to said first and second ends of said series-connected body respectively while applying a precharge voltage to a prescribed node of said series-connected body for supplying charges, and comparing with a predetermined threshold voltage a voltage generated on said prescribed node when applying said first and second reference voltages to said first and second ends of said series-connected body in place of said analog signal and said prescribed voltage respectively while stopping application of said precharge voltage, said series-connected body having a capacitance between said prescribed node and said first end of said series-connected body, and a second capacitance, which is different from said first capacitance, between said prescribed node and said first end of said series-connected body, said compare circuit adjusting the ratio of said first to second capacitances in accordance with at least one of said first and second reference voltages.

2. The A-D converter in accordance with claim 1, wherein said voltage generating circuit fixes said second reference voltage at said prescribed voltage and changes the value of said first reference voltage by half the preceding change every time said compare circuit repeats comparison, and then stops changing said first reference voltage and changes the value of said second reference voltage by half the preceding change every time said compare circuit repeats comparison, and said compare circuit has a capacitance, being smaller than that existing between said prescribed node and said first end of said series-connected body, between said prescribed node and said second end of said series-connected body, said A-D converter further comprising an adjusting capacitor for switching connection and disconnection with said series-connected body about a prescribed value of said first reference voltage for adjusting the ratio of said first capacitance to said second capacitance.

3. The A-D converter in accordance with claim 2, wherein said adjusting capacitor is connected in parallel with said second capacitance when said analog signal is larger than a prescribed value, while being disconnected when said analog signal is smaller than said prescribed value.

4. The A-D converter in accordance with claim 2, wherein said adjusting capacitor is connected in parallel with said first capacitance when said analog signal is smaller than a prescribed value, while being disconnected when said analog signal is larger than said prescribed value.

5. An A-D converter comprising:

a voltage generating circuit for generating first and second reference voltages with reference to a prescribed voltage; and a compare circuit having a series-connected body including a plurality of serially interconnected MOS capacitors and having first and second ends for applying an analog signal and said prescribed voltage to said first and second ends of said series-connected body respectively while applying a precharge voltage to a prescribed node of said series-connected body for supplying charges, and comparing with a predetermined threshold voltage, a voltage generated on said prescribed node when applying said first and second reference voltages to said first and second ends of said series-connected body in place of said analog signal and said prescribed voltage respectively while stopping application of said precharge voltage, said series-connected body having a capacitance, between said prescribed node and said first end of said series-connected body and a second capacitance, which is bigger between said prescribed node and said second end of said series-connected body, said compare circuit further having a voltage shift circuit for shifting a voltage being applied between said first end of said series-connected body and said prescribed node in a reducing direction.

6. The A-D converter in accordance with claim 5, wherein said voltage shift circuit shifts said precharge voltage and said threshold voltage by the same value.

7. The A-D converter in accordance with claim 6, wherein said compare circuit further includes:
- a first transistor having a control electrode being connected to said prescribed node, a first current electrode being connected to a first power source, and a second current electrode being connected to an output terminal of said compare circuit,
- a second transistor having a control electrode being connected to said prescribed node, a first current electrode being connected to a second power source and a second current electrode being connected to said output terminal of said compare circuit, and
- a switch being connected between said control electrode and said second current electrode of said first transistor to be closed when setting said prescribed node of said series-connected body at said precharge voltage and open when comparing said voltage generated on said prescribed node with said predetermined threshold voltage, and
- said voltage shift circuit includes a structure for rendering a transistor amplification coefficient of said first transistor smaller than that of said second transistor.

8. An A-D converter comprising:
a voltage generating circuit for generating first and second reference voltages with reference to a prescribed voltage; and
a compare circuit having a series-connected body including a plurality of serially interconnected MOS capacitors and having first and second ends for applying an analog signal and said prescribed voltage to said first and second ends of said series-connected body respectively while applying a precharge voltage to a prescribed node of said series-connected body for supplying charges, and comparing with a predetermined threshold voltage a voltage generated on said prescribed node when applying said first and second reference voltages to said first and second ends of said series-connected body in place of said analog signal and said prescribed voltage respectively while stopping application of said precharge voltage, said series-connected body having a first capacitance between said prescribed node and said first end of said series-connected body, and a second capacitance, which is bigger than said first capacitance, between said prescribed node and said second end of said series-connected body.

said voltage generating circuit adjusting at least one of said prescribed voltage and said second reference voltage for compensating for change of a charge quantity being caused in said series-connected body by change of said first capacitance.

9. The A-D converter in accordance with claim 8, wherein said voltage generating circuit has an adjusting circuit for adjusting said prescribed voltage and said second reference voltage so that the difference between a voltage applied between said prescribed node and said first end of said series-connected body and that applied between said prescribed node and said second end of said series-connected body is below a prescribed value.

10. The A-D converter in accordance with claim 9, wherein
said prescribed voltage is a ground voltage,
said voltage generating circuit further includes:
- a plurality of resistances being serially connected between a reference voltage and said ground voltage,
- a first group of switches for selecting one of a plurality of divided voltages generated on respective nodes of said plurality of resistances as said first reference voltage,
- a second group of switches for selecting one divided voltage from a first group of divided voltages among said plurality of divided voltages as said second reference voltage, and
- a third group of switches for selecting one divided voltage from a second group of divided voltages, having values closer to said reference voltage than said first group of divided voltage group, among said plurality of divided voltages as said second reference voltage, and said adjusting circuit includes:
- a fourth group of switches for further selecting said divided voltages being selected by said second and third groups of switches and applying the same to said second end of said series-connected body, and
- a fifth group of switches for selecting predetermined first and second divided voltages from said plurality of divided voltages, said ground voltage and said reference voltage as said prescribed voltage and applying the same to said second end of said series-connected body.

* * * * *